US012562703B2

(12) United States Patent
     Kojima

(10) Patent No.: US 12,562,703 B2
(45) Date of Patent: Feb. 24, 2026

(54) OFFSET CORRECTION CIRCUIT

(71) Applicant: Mitsubishi Electric Corporation,
     Tokyo (JP)

(72) Inventor: Tomokazu Kojima, Tokyo (JP)

(73) Assignee: Mitsubishi Electric Corporation,
     Tokyo (JP)

( * ) Notice: Subject to any disclaimer, the term of this
     patent is extended or adjusted under 35
     U.S.C. 154(b) by 726 days.

(21) Appl. No.: 17/937,892

(22) Filed: Oct. 4, 2022

(65) Prior Publication Data

US 2023/0028576 A1     Jan. 26, 2023

Related U.S. Application Data

(63) Continuation of application No. 17/289,109, filed as
     application No. PCT/JP2018/042654 on Nov. 19,
     2018, now abandoned.

(51) Int. Cl.
     H03F 3/45 (2006.01)
     H03F 3/345 (2006.01)
     H03F 3/72 (2006.01)

(52) U.S. Cl.
     CPC ......... H03F 3/45771 (2013.01); H03F 3/345
          (2013.01); H03F 3/45183 (2013.01); **H03F
          3/72** (2013.01); *H03F 3/45475* (2013.01);
              *H03F 2203/45212* (2013.01); *H03F
          2203/45286* (2013.01); *H03F 2203/45396*
                                            (2013.01)

(58) Field of Classification Search
     CPC .. H03F 3/45771; H03F 3/345; H03F 3/45183;
               H03F 3/72; H03F 3/45475; H03F 2203/45212; H03F 2203/45286; H03F
          2203/45396; H03F 2200/447; H03F
          2203/45391; H03F 2203/45392;
     (Continued)

(56) References Cited

U.S. PATENT DOCUMENTS 8,102,156 B2 *  1/2012  Nodo ................. H03F 3/45183
                                                      327/52
     9,874,894 B2    1/2018  Onishi
                     (Continued)

FOREIGN PATENT DOCUMENTS

JP     554107657 A     8/1979
     JP     2002286573 A   10/2002
                     (Continued)

OTHER PUBLICATIONS

International Search Report (PCT/ISA/210) with translation and
Written Opinion (PCT/ISA/237) mailed on Feb. 19, 2019, by the
Japan Patent Office as the International Searching Authority for
International Application No. PCT/JP2018/042654.
                     (Continued)

*Primary Examiner* — Khanh V Nguyen
(74) *Attorney, Agent, or Firm* — .Buchanan Ingersoll &
Rooney PC

(57)                ABSTRACT

A first correction voltage generation circuit provides a first
positive or negative correction voltage for correcting an
input voltage. A second correction voltage generation circuit
provides a second correction voltage identical in polarity to
the first correction voltage in accordance with the first
correction voltage. The second correction voltage is gener-
ated to have a temperature coefficient reverse in polarity to
a temperature coefficient of the first correction voltage.

4 Claims, 19 Drawing Sheets

(58) Field of Classification Search
CPC . H03F 1/02; H03F 1/303; H03F 3/005; H03F
3/45085; H03F 1/3211; H03F 3/45071
See application file for complete search history.

(56) References Cited

U.S. PATENT DOCUMENTS

| | | | |
|---|---|---|---|
| 9,917,552 | B2 | 3/2018 | Iwamoto |
| 10,310,528 | B1 * | 6/2019 | Elsayed ................. G05F 1/565 |
| 10,312,877 | B2 | 6/2019 | Matsuno et al. |
| 2003/0006822 | A1 | 1/2003 | Murakami et al. |
| 2017/0272038 | A1 | 9/2017 | Iwamoto |
| 2022/0123701 | A1 | 4/2022 | Kojima |

FOREIGN PATENT DOCUMENTS

| | | |
|---|---|---|
| JP | 2007318394 A | 12/2007 |
| JP | 2017005488 A | 1/2017 |
| JP | 2017169092 A | 9/2017 |

OTHER PUBLICATIONS

Office Action dated Feb. 9, 2022, issued in corresponding Indian Patent Application No. 202147017932, 5 pages.

Wang, Alice , et al., "Sub-Threshold Design for Ultra Low-Power Systems" , p. 30, Springer, 2006 (4 pages).

Office Action issued in corresponding Japanese Application No. JP 2020-557038, mailed on Nov. 22, 2022, 8 pages including 4 pages of English Translation.

Notice of Reasons for Refusal issued in Japanese Application No. 2020-557038; Mailed May 9, 2023. 8 Pages (with Translation).

First Office Action dated Aug. 5, 2024, issued in the corresponding Chinese Patent Application No. 201880099495.4, 12 pages including 5 pages of English Translation.

* cited by examiner

| | POLARITY | |
|---|---|---|
| Voffset (OPERATIONAL AMPLIFIER) | POSITIVE | NEGATIVE |
| ΔV1 (FIRST CORRECTION VOLTAGE GENERATION CIRCUIT 110) | NEGATIVE | POSITIVE |
| TEMPERATURE COEFFICIENT OF ΔV1 | NEGATIVE | POSITIVE |
| ΔV2 (SECOND CORRECTION VOLTAGE GENERATION CIRCUIT 120) | NEGATIVE | POSITIVE |
| TEMPERATURE COEFFICIENT OF ΔV2 | POSITIVE | NEGATIVE |

REVERSE POLARITY

FIG. 7

Voffset<0 (NEGATIVE)

| POSITIVE-SIDE CORRECTION LEVEL | FIRST CORRECTION VOLTAGE GENERATION CIRCUIT 110 | | SECOND CORRECTION VOLTAGE GENERATION CIRCUIT 120 | | TOTAL CORRECTION VOLTAGE [mV] ($\Delta V1 + \Delta V2$) |
|---|---|---|---|---|---|
| | $\Delta V1$ [mV] | TEMPERATURE COEFFICIENT OF $\Delta V1$ [V/deg] | $\Delta V2$ [mV] | TEMPERATURE COEFFICIENT OF $\Delta V2$ [V/deg] | |
| 0 | 0 | $0\mu$ | 0 | $0\mu$ | 0 |
| 1 | 1 | $200\mu$ | 1 | $-200\mu$ | 2 |
| 2 | 2 | $400\mu$ | 2 | $-400\mu$ | 4 |
| 3 | 3 | $600\mu$ | 3 | $-600\mu$ | 6 |

FIG.8

Voffset > 0 (POSITIVE)

| NEGATIVE-SIDE CORRECTION LEVEL | FIRST CORRECTION VOLTAGE GENERATION CIRCUIT 110 | | SECOND CORRECTION VOLTAGE GENERATION CIRCUIT 120 | | TOTAL CORRECTION VOLTAGE [mV] ($\Delta V1 + \Delta V2$) |
|---|---|---|---|---|---|
| | $\Delta V1$ [mV] | TEMPERATURE COEFFICIENT OF $\Delta V1$ [V/deg] | $\Delta V2$ [mV] | TEMPERATURE COEFFICIENT OF $\Delta V2$ [V/deg] | |
| 0 | 0 | 0 $\mu$ | 0 | 0 $\mu$ | 0 |
| 1 | -1 | -200 $\mu$ | -1 | 200 $\mu$ | -2 |
| 2 | -2 | -400 $\mu$ | -2 | 400 $\mu$ | -4 |
| 3 | -3 | -600 $\mu$ | -3 | 600 $\mu$ | -6 |

BP SETTING INPUT
(A PLURALITY
OF PATTERNS)

CONTROLLER 160

STD ← TEMPERATURE DETECTION CIRCUIT 180

B11~B14, B21~B24

BP0~BP3, BN0~BN3

VIN → FIRST CORRECTION VOLTAGE GENERATION CIRCUIT 110 → V1 → SECOND CORRECTION VOLTAGE GENERATION CIRCUIT 120 → V2 → OUTPUT STAGE 150 → VOUT

VRIN

180

VDDA        VDDA        VDDA

Np        Np

Rd1    Rd3

Ni1        VR    185

VD

Rd2        Ni2    STD

D0

Ng        Ng        GNDA

GNDA      GNDA

FIG.21
(a)
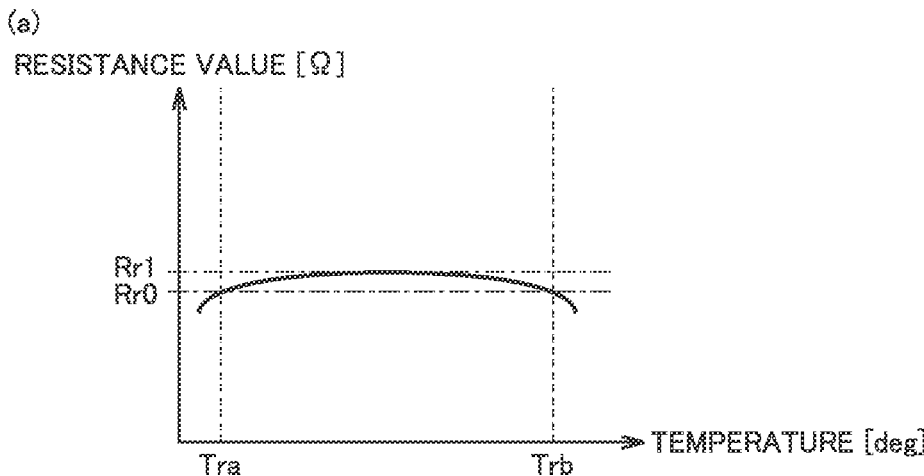
(b)
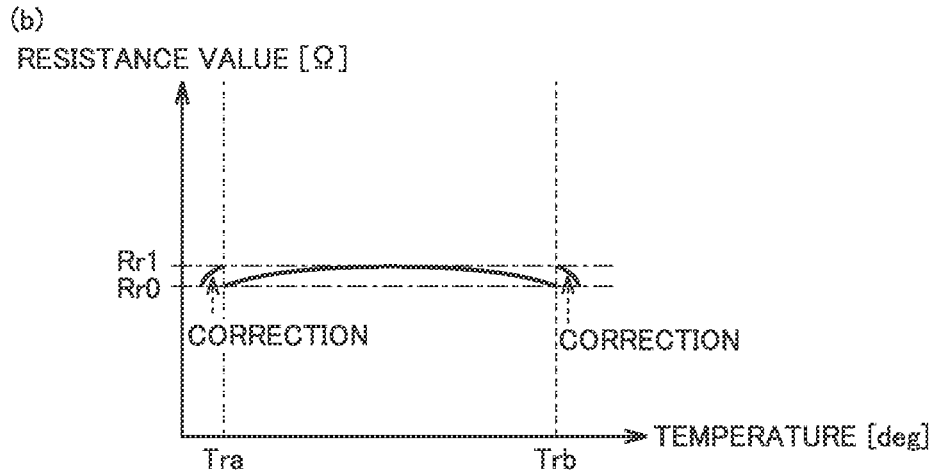

FIG.22
(a)
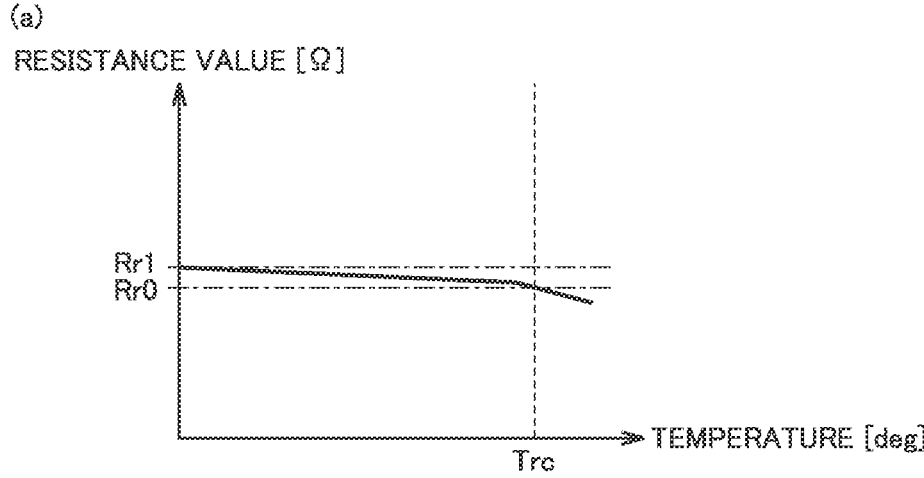
(b)
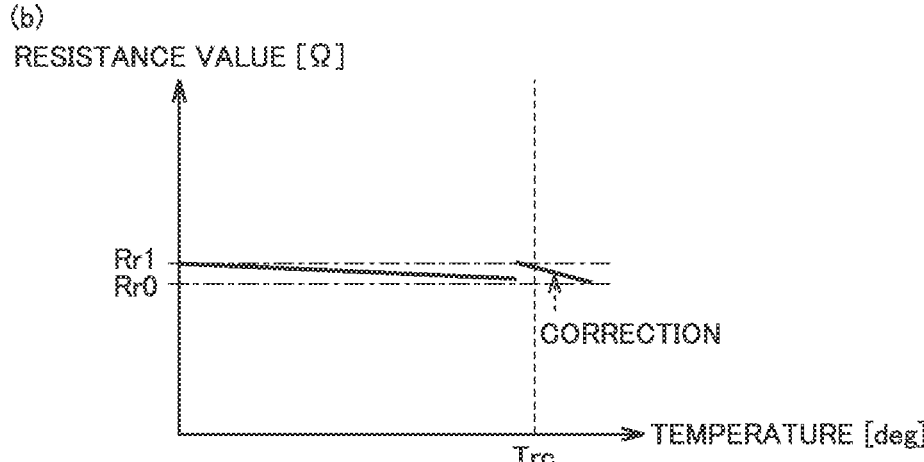

OFFSET CORRECTION CIRCUIT

This application is a continuation of U.S. patent application Ser. No. 17/289,109, filed on Apr. 27, 2021, which is a national stage application PCT/JP2018/042654, filed on Nov. 19, 2018, the entire content of each of which is incorporated herein by reference.

TECHNICAL FIELD

The present disclosure relates to an offset correction circuit.

BACKGROUND ART

With development of the Internet of Things (IoT) technologies, technical needs for highly accurate sensor and sensor interface have recently increased. Specifically, a system technology for accurately receiving information from a sensor device at an operational amplifier and a comparator in an input stage, performing analog signal processing or digital signal processing on the information, and connecting people and objects by using the information detected by the sensor is required.

At this time, needs for an operational amplifier and a comparator low in offset voltage that are as highly accurate as a bipolar process in a complementary metal oxide semiconductor (CMOS) process suitable for digital signal processing have increased.

Japanese Patent Laying-Open No. 2017-169092 (PTL 1) describes, as an offset correction circuit for achieving a low offset voltage, a configuration of an amplifier circuit including differential pair transistors and active load transistors connected to the differential pair transistors, a plurality of offset correction current sources and a plurality of offset correction switches further being connected in parallel to the active load transistors.

In such a configuration, an offset voltage is corrected by generating a suitable correction current value by selectively operating the plurality of offset correction current sources by controlling the plurality of offset correction switches in accordance with an offset voltage generated due to variation among elements. In particular, in PTL 1, the offset voltage can be corrected by suppressing temperature drift by implementing each offset correction current source with a current source stable in current value toward a temperature and a resistive element stable in resistance value toward a temperature, that is, a current source and a resistive element without being dependent on a temperature.

CITATION LIST

Patent Literature

PTL 1: Japanese Patent Laying-Open No. 2017-169092

Non Patent Literature

NPL 1: Alice Wang, Benton Highsmith Calhoun, Anantha P. Chandrakasan, "SUB-THRESHOLD DESIGN FOR ULTRA LOW-POWER SYSTEMS," page 30, Springer, 2006

SUMMARY OF INVENTION

Technical Problem

It is difficult, however, to manufacture a voltage source and a resistive element completely independent of a temperature per se, and there is a concern about increase in cost for components by adoption of a voltage source and a resistive element sufficiently low in temperature dependency.

The present disclosure was made to solve such problems, and an object of the present disclosure is to provide an offset correction circuit to perform a function to correct an offset voltage with temperature drift being suppressed, by allowing use of an element with temperature dependency.

Solution to Problem

In one aspect of the present disclosure, an offset correction circuit includes a first correction voltage generation circuit and a second correction voltage generation circuit. The first correction voltage generation circuit provides a first positive or negative correction voltage for correcting an input voltage. The second correction voltage generation circuit provides a second correction voltage in accordance with the first correction voltage. The second correction voltage is identical in polarity to the first correction voltage and has a second temperature coefficient reverse in polarity to a first temperature coefficient of the first correction voltage.

Advantageous Effects of Invention

According to the present disclosure, the first temperature coefficient of the first correction voltage is reverse in polarity to the second temperature coefficient of the second correction voltage. Therefore, even though the first and second correction voltage generation circuits are configured with an element with temperature dependency, the function to correct the offset voltage with temperature drift being suppressed can be performed by suppressing fluctuation of the sum of the first correction voltage and the second correction voltage with variation in temperature.

BRIEF DESCRIPTION OF DRAWINGS

FIG. 4 is an equivalent circuit diagram of the first correction voltage generation circuit shown in FIG. 3.

FIG. 6 is a chart illustrating an operating state of the first and second correction voltage generation circuits.

FIG. 7 is a first chart illustrating an exemplary operation for correcting an offset voltage.

FIG. 8 is a second chart illustrating an exemplary operation for correcting an offset voltage.

FIG. 21 shows a conceptual graph for illustrating non-linear temperature dependency of a resistive element and compensation therefor.

FIG. 22 shows a conceptual graph for illustrating fluctuation in resistance value and compensation therefor in a high-temperature region when a diffusion resistance on a semiconductor substrate is provided by a resistive element.

DESCRIPTION OF EMBODIMENTS

Figure 1:
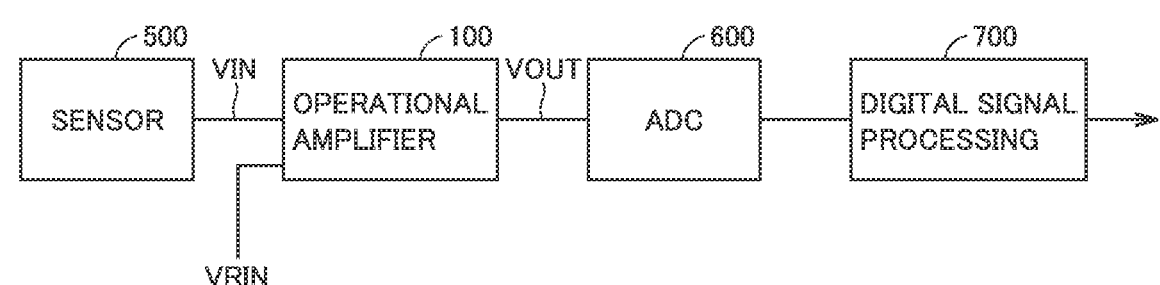
FIG. 1 is a schematic block diagram illustrating an exemplary overall configuration of a system in which an operational amplifier to which an offset correction circuit according to the present embodiment is applied serves as a sensor interface.

Embodiments of the present disclosure will be described in detail below with reference to the drawings. The same or corresponding elements in the drawings have the same reference characters allotted below and description thereof will not be repeated in principle.

First Embodiment

FIG. 1 is a schematic block diagram illustrating an exemplary overall configuration of a system in which an operational amplifier to which an offset correction circuit according to the present embodiment is applied serves as a sensor interface.

The system shown in FIG. 1 includes an operational amplifier 100, a sensor 500, an analog to digital converter (ADC) 600, and a digital signal processing circuit 700.

Sensor 500 is, for example, a temperature sensor or a displacement sensor, and provides a voltage value (sensor voltage value) that varies with a physical quantity such as a temperature or displacement of an object to be measured. Operational amplifier 100 receives a sensor voltage value from sensor 500 as an input voltage VIN at a first input terminal and receives a reference voltage VRIN at a second input terminal. Operational amplifier 100 operates as a differential amplifier and provides from an output terminal, an output voltage VOUT resulting from amplification of a difference in electric power between input voltage VIN and reference voltage VRIN. For example, operational amplifier 100 can provide a sensor voltage value as output voltage VOUT, by operating as what is called a voltage follower circuit in which the output terminal and the second input terminal are connected to each other.

ADC 600 samples output voltage VOUT (analog voltage) from operational amplifier 100 and converts the output voltage to a digital signal. Digital signal processing circuit 700 performs predetermined computing processing onto the digital signal provided by ADC 600. The system shown in FIG. 1 can thus control devices with a detection value from sensor 500.

With highly accurate development of sensor 500, a physical quantity of an object to be measured has highly accurately been detected in recent years. On the other hand, there is a concern about lowering in overall detection accuracy due to accuracy of the sensor interface to take in a sensor voltage value, which is represented by influence by an offset voltage in operational amplifier 100. Therefore, the offset correction circuit according to the present embodiment is applied to operational amplifier 100.

Figure 2:
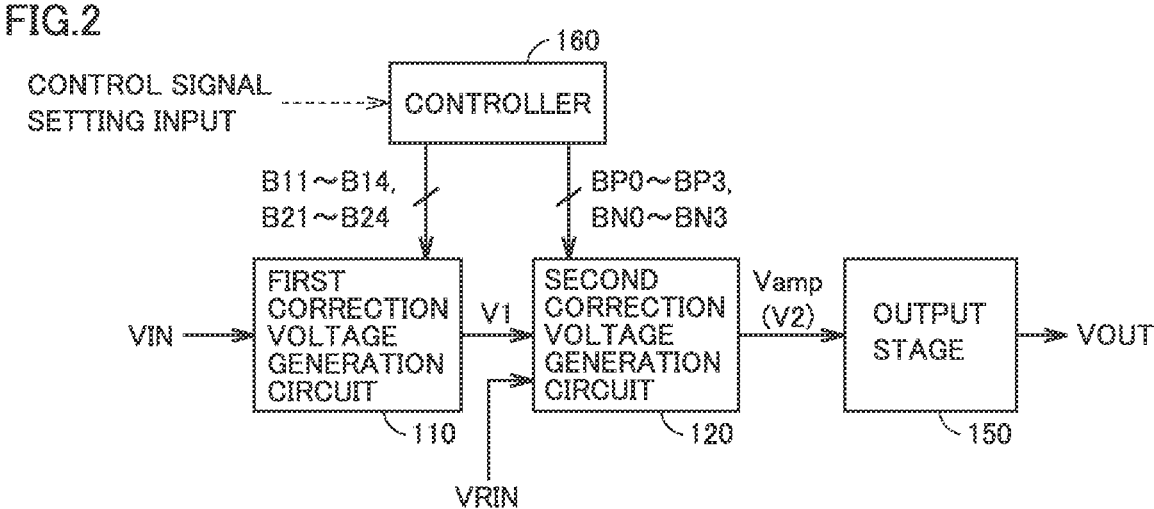
FIG. 2 is a block diagram illustrating an exemplary configuration of an operational amplifier to which an offset correction circuit according to a first embodiment is applied.

FIG. 2 is a block diagram illustrating an exemplary configuration of the operational amplifier to which an offset correction circuit according to a first embodiment is applied.

Referring to FIG. 2, operational amplifier 100 includes a first correction voltage generation circuit 110, a second correction voltage generation circuit 120, an output stage 150, and a controller 160. Controller 160 provides control signals B11 to B14 and B21 to B24 to first correction voltage generation circuit 110. Similarly, controller 160 provides control signals BP0 to BP3 and BN0 to BN3 to second correction voltage generation circuit 120.

Control signals B11 to B14, B21 to B24, BP0 to BP3, and BN0 to BN3 are set in advance and stored in controller 160. Controller 160 does not have to be configured integrally with operational amplifier 100. Control signals B11 to B14, B21 to B24, BP0 to BP3, and BN0 to BN3 can also be provided from the outside of operational amplifier 100.

First correction voltage generation circuit 110 provides a first voltage V1 (V1=VIN+$\Delta$V1) resulting from addition of an offset correction voltage $\Delta$V1 to an input voltage VIN to operational amplifier 100. As will be clear in the description below, offset correction voltage $\Delta$V1 can be adjusted to any of a positive voltage ($\Delta$V1>0) and a negative voltage ($\Delta$V1<0) in accordance with control signals B11 to B14 and B21 to B24. Control signals B11 to B14 and B21 to B24 correspond to one embodiment of the "first control signal."

Second correction voltage generation circuit 120 generates a second voltage V2 (V2=VIN+$\Delta$V1+$\Delta$V2) resulting from addition of an offset correction voltage $\Delta$V2 controlled in accordance with control signals BN0 to BN3 and BP0 to BP3 to first voltage V1 from first correction voltage generation circuit 110. As will be clear from the description below, offset correction voltage $\Delta V2$ can also be adjusted to any of a positive voltage ($\Delta V2>0$) and a negative voltage ($\Delta V2<0$). Control signals BN0 to BN3 and BP0 to BP3 correspond to one embodiment of the "second control signal."

Second correction voltage generation circuit 120 provides a voltage Vamp resulting from amplification of a difference between second voltage V2 and reference voltage VRIN (FIG. 1) to output stage 150. Output stage 150 generates output voltage VOUT in accordance with voltage Vamp provided from second correction voltage generation circuit 120. Output voltage VOUT is provided to ADC 600 shown in FIG. 1.

In the present embodiment below, operational amplifier 100 is assumed to operate as a voltage follower circuit by satisfying a condition of VRIN=VOUT in the configuration in FIG. 2. Therefore, voltage Vamp from second correction voltage generation circuit 120 is comparable to second voltage V2 ($V2=VIN+\Delta V1+\Delta V2$).

An exemplary configuration of each circuit in FIG. 2 will be described in detail below.

Figure 3:
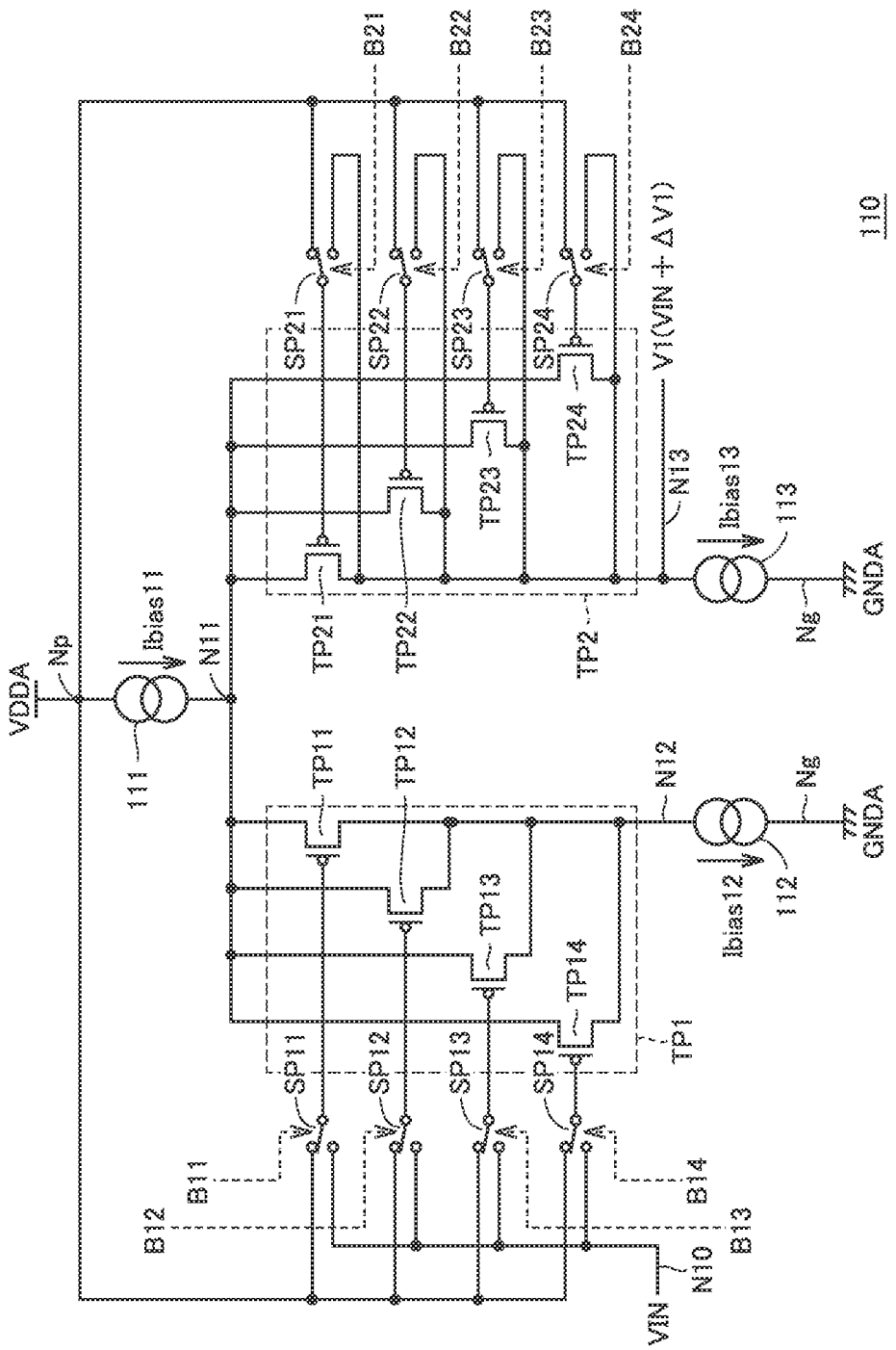
FIG. 3 is a circuit diagram illustrating an exemplary configuration of a first correction voltage generation circuit shown in FIG. 2.

FIG. 3 is a circuit diagram illustrating an exemplary configuration of first correction voltage generation circuit 110.

Referring to FIG. 3, first correction voltage generation circuit 110 includes current sources 111 to 113, a plurality of transistors TP11 to TP14 connected in parallel, switches SP11 to SP14 arranged in the plurality of transistors TP11 to TP14, respectively, a plurality of transistors TP21 to TP24 connected in parallel, and switches SP21 to SP24 arranged in the plurality of transistors TP21 to TP24, respectively.

Current source 111 is connected between a power supply node Np that supplies a power supply voltage VDDA and a node N11 and provides a constant current Ibias11. The plurality of transistors TP11 to TP14 are implemented by p-type field effect transistors and connected in parallel between node N11 and a node N12. Current source 112 is connected between node N12 and a reference voltage node Ng and provides a constant current Ibias12. Reference voltage node Ng supplies, for example, a ground voltage GNDA.

Similarly, the plurality of transistors TP21 to TP24 are implemented by p-type field effect transistors and connected in parallel between node N11 and a node N13 where first voltage V1 is provided. Current source 113 is connected between node N13 and reference voltage node Ng and provides a constant current Ibias13. Current sources 112 and 113 are equal to each other in output current. In other words, relation of Ibias12=Ibias13=(Ibias11)/2 is satisfied.

The plurality of transistors TP11 to TP14 have their gates connected to a node N10 to which input voltage VIN is provided and power supply node Np via switches SP11 to SP14 controlled in accordance with control signals B11 to B14. Therefore, the gates of transistors TP11 to TP14 receive input of input voltage VIN or power supply voltage VDDA in accordance with control signals B11 to B14. Each of transistors TP11 to TP14 is biased to operate in a subthreshold region.

Similarly, the plurality of transistors TP21 to TP24 have their gates connected to node N13 and power supply node Np via switches SP21 to SP24 controlled in accordance with control signals B21 to B24. Therefore, the gates of transistors TP21 to TP24 receive input of power supply voltage VDDA or are connected to node N13 in accordance with control signals B21 to B24. Each of transistors TP21 to TP24 is also biased to operate in the subthreshold region.

A transistor that receives input of power supply voltage VDDA at its gate among the plurality of transistors TP11 to TP14 cannot form a current path between node N11 and node N12 or node N13. Therefore, the plurality of transistors TP11 to TP14 can configure a transistor TP1 a transistor size of which is variably controlled by control signals B11 to B14. Similarly, the plurality of transistors TP21 to TP24 can configure a transistor TP2 a transistor size of which is variably controlled in accordance with control signals B21 to B24. Though four transistors connected in parallel configure each of transistors TP1 and TP2 in FIG. 3, any plurality of transistors can configure the same.

Figure 4:
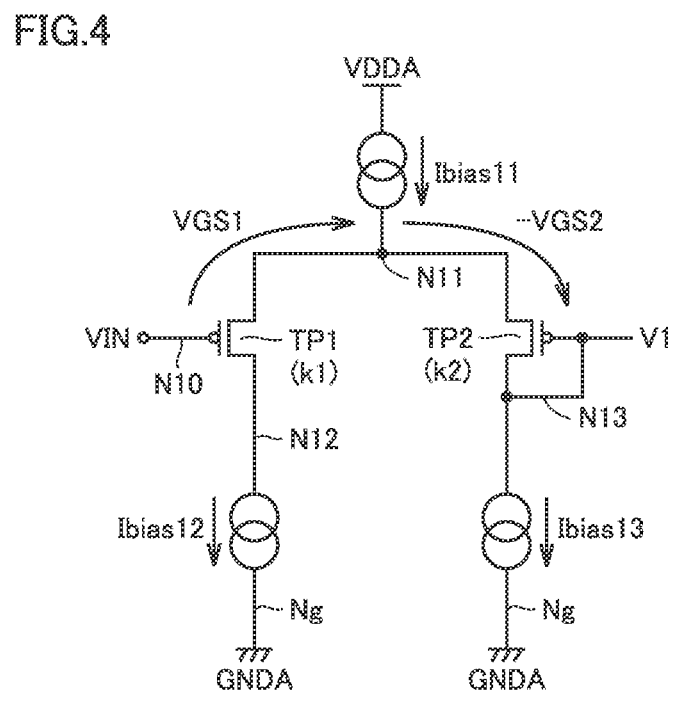

FIG. 4 shows an equivalent circuit diagram of first correction voltage generation circuit 110 including transistors TP1 and TP2.

Referring to FIG. 4, as transistors TP1 and TP2 operate in the subthreshold region, an expression (1) below holds between first voltage V1 of node N13 and input voltage VIN of node N10, where VGS1 represents a gate-source voltage of transistor TP1 and VGS2 represents a gate-source voltage of transistor TP2.

$$V1=VIN+VGS1-VGS2 \tag{1}$$

An expression below holds between a gate-source voltage VGS of a transistor in the subthreshold region and a drain current IDS as shown in NPL 1:

$$IDS=I0 \cdot M \cdot \exp((VGS-Vth)/(\eta \cdot VT)) \tag{2}$$

where I0 represents a constant determined by process information such as mobility of the transistor and a thickness of a gate oxide film, M represents a transistor size, Vth represents a threshold voltage of the transistor, VT represents a thermal voltage, $\eta$ represents a subthreshold constant determined by a process value. In particular, it has been known that a thermal voltage VT at an absolute temperature T is expressed as $VT=k \cdot T/q$ (k representing a Boltzmann constant and q representing an amount of charges of an electron).

When the expression (2) is solved in terms of VGS, an expression (3) below is obtained.

$$VGS=\eta \cdot VT \cdot \ln(IDS/(I0 \cdot M))+Vth \tag{3}$$

The transistor size M of transistor TP1 is expressed as $M=k1 \cdot (W/L)$ where k1 represents a variable controlled in accordance with control signals B11 to B14. Similarly, the transistor size M of transistor TP2 is expressed as $M=k2 \cdot (W/L)$ where k2 represents a variable controlled in accordance with control signals B21 to B24. Based on the expression (3), VGS1 of transistor TP1 and VGS2 of transistor TP2 are expressed in expressions (4) and (5) below.

$$VGS1=\eta \cdot VT \cdot \ln(IDS/I0 \cdot k1 \cdot (W/L))+Vth \tag{4}$$

$$VGS2=\eta \cdot VT \cdot \ln(IDS/I0 \cdot k2 \cdot (W/L))+Vth \tag{5}$$

When current Ibias12 from current source 112 is designed to be equal to current Ibias13 from current source 113, IDSs in the expressions (4) and (5) are equal to each other. At this time, based on the expressions (4) and (5), relation of $(VGS1-VGS2)=\eta \cdot VT \cdot \ln(k2/k1)$ is satisfied. By substituting this relation into the expression (1), the expression (1) is transformed to an expression (6) including (k2/k1) as a variable.

$$V1=VIN+\eta \cdot VT \cdot \ln(k2/k1) \tag{6}$$

By setting thermal voltage VT in the expression (6) to $VT=k \cdot T/q$, correction voltage $\Delta V1$ from first correction voltage generation circuit 110 is expressed in an expression (7) below.

$$\Delta V1 = \eta \cdot (kT/q) \cdot \ln(k2/k1) \qquad (7)$$

Depending on combination of control signals B11 to B14 and B21 to B24, (k2/k1) corresponding to the ratio of the transistor size between transistors TP1 and TP2 can be varied.

When a condition of (k2/k1)>1 is satisfied, that is, when transistor TP2 is larger in transistor size than transistor TP1, a condition of $\Delta V1 > 0$ can be satisfied based on a condition of $\ln(k2/k1) > 0$. In contrast, when a condition of (k2/k1)<1 is satisfied, that is, when transistor TP1 is larger in transistor size than transistor TP2, a condition of $\Delta V1 < 0$ is satisfied based on a condition of $\ln(k2/k1) < 0$. When a condition of k1=k2 is satisfied, a condition of $\Delta V1 = 0$ can be satisfied based on a condition of $\ln(k2/k1) = 0$.

Thus, first correction voltage generation circuit 110 can provide first voltage V1 by adding correction voltage $\Delta V1$ adjustable to any of a positive value, a negative value, and zero depending on combination of control signals B11 to B14 and B21 to B24 to input voltage VIN.

Temperature dependency of correction voltage $\Delta V1$ from first correction voltage generation circuit 110 is expressed with a temperature coefficient of first correction voltage $\Delta V1$ in accordance with an expression (8) below obtained by differentiating the expression (7) with respect to a temperature (an absolute temperature) T.

$$d(\Delta V1)/dT = \eta \cdot (k/q) \cdot \ln(k2/k1) \qquad (8)$$

It is understood from the expression (8) that a sign (polarity) of the temperature coefficient of $\Delta V1$ is determined in coordination with a sign of $\ln(k2/k1)$, that is, the sign (polarity) of $\Delta V1$. In other words, it is understood that, when the condition of $\Delta V1 > 0$ is set, a condition of $d(\Delta V1)/dT > 0$ is satisfied, that is, temperature dependency is "positive", and when the condition of $\Delta V1 < 0$ is set, a condition of $d(\Delta V1)/dT < 0$ is satisfied, that is, temperature dependency is "negative".

In FIGS. 3 and 4, transistor TP1 corresponds to one embodiment of the "first field effect transistor," transistor TP2 corresponds to one embodiment of the "second field effect transistor," and current sources 111 to 113 correspond to one embodiment of the "first current source group." Switches SP11 to SP14 and SP21 to SP24 arranged in correspondence with the plurality of transistors connected in parallel to configure transistors TP1 and TP2 correspond to one embodiment of the "transistor size ratio control mechanism."

Figure 5:
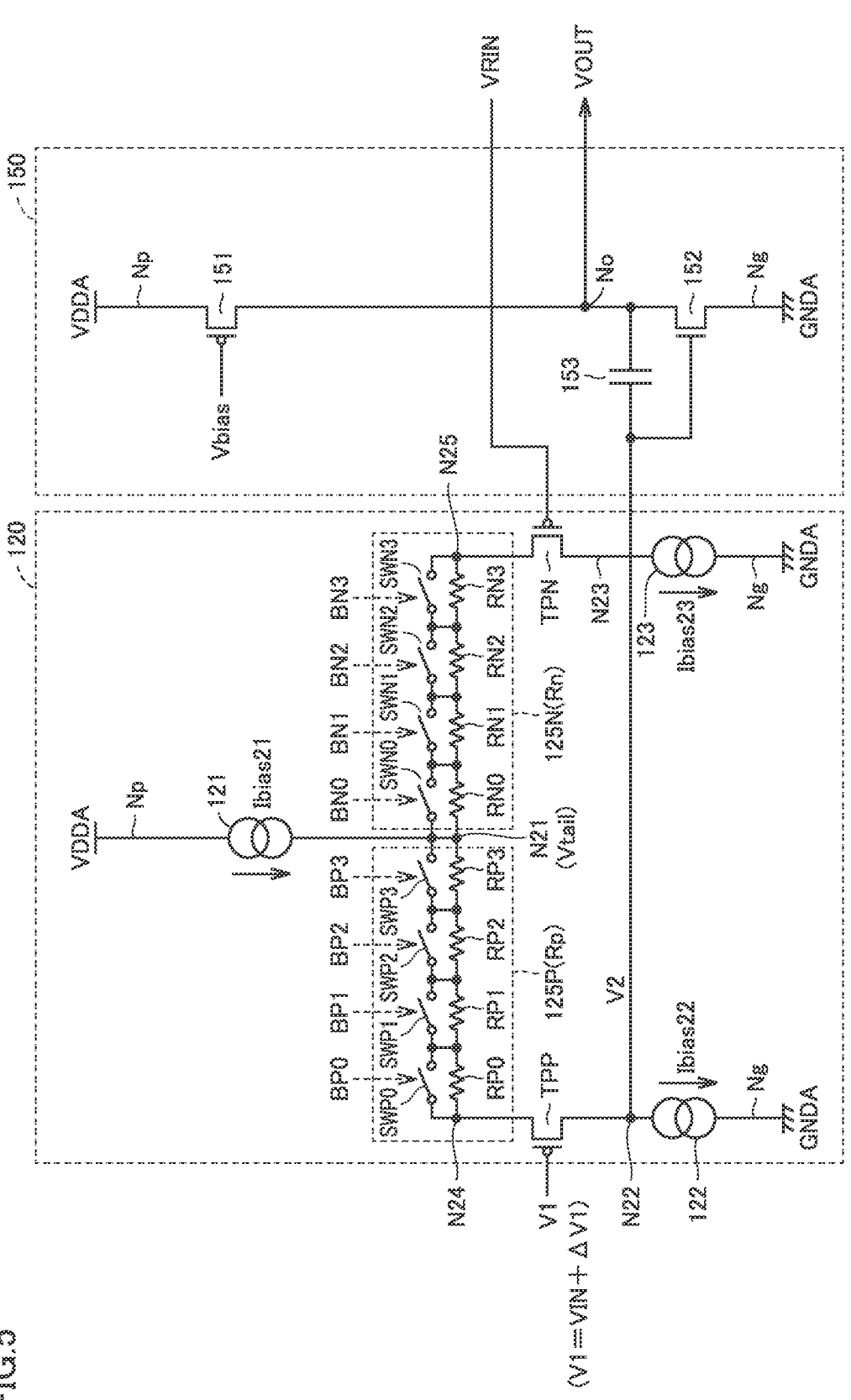
FIG. 5 is a circuit diagram illustrating an exemplary configuration of a second correction voltage generation circuit and an output stage shown in FIG. 2.

FIG. 5 is a circuit diagram illustrating an exemplary configuration of second correction voltage generation circuit 120 and output stage 150.

Referring to FIG. 5, second correction voltage generation circuit 120 includes current sources 121 to 123, variable resistors 125P and 125N, and transistors TPP and TPN. Transistors TPP and TPN are assumed to operate in a subthreshold region or a saturated region.

Current source 121 is connected between power supply node Np to supply power supply voltage VDDA and a node N21 and provides constant current Ibias21. Variable resistor 125P is connected between node N21 and a node N24. Transistor TPP is implemented by a p-type field effect transistor and connected between node N24 and a node N22. Similarly, variable resistor 125N is connected between node N21 and a node N25. Transistor TPN is implemented by a p-type field effect transistor and connected between node N25 and a node N23.

Current source 122 is connected between node N22 and reference voltage node Ng and provides a constant current Ibias22. Current source 123 is connected between node N23 and reference voltage node Ng and provides a constant current Ibias23. Current sources 122 and 123 are equal in output current by being comparable in output current characteristics. In other words, relation of Ibias22=Ibias23=(Ibias21)/2 is satisfied.

Variable resistor 125P includes a plurality of resistive elements RP0 to RP3 connected in series between node N24 and node N21 and bypass switches SWP0 to SWP3 connected in parallel to the plurality of resistive elements RP0 to RP3, respectively. Electrical resistance values of resistive elements RP0 to RP3 are also denoted as RP0 to RP3, respectively, below. Bypass switches SWP0 to SWP3 are opened and closed in accordance with control signals BP0 to BP3. Therefore, an electrical resistance value Rp between node N24 and node N21 of variable resistor 125P is controlled in accordance with control signals BP0 to BP3.

Similarly, variable resistor 125N includes a plurality of resistive elements RN0 to RN3 connected in series between node N21 and N25 and bypass switches SWN0 to SWN3 connected in parallel to the plurality of resistive elements RN0 to RN3, respectively. Electrical resistance values of resistive elements RN0 to RN3 are also denoted as RN0 to RN3, respectively, below. Bypass switches SWN0 to SWN3 are opened and closed in accordance with control signals BN0 to BN3. Therefore, an electrical resistance value Rn between node N25 and node N21 of variable resistor 125N is controlled in accordance with control signals BN0 to BN3.

Transistor TPP receives at its gate, input of first voltage V1 from first correction voltage generation circuit 110. Transistor TPN receives at its gate, input of reference voltage VRIN provided to operational amplifier 100. Therefore, a voltage resulting from differential amplification of a voltage difference between first voltage V1 and reference voltage VRIN is provided to node N22.

By providing a difference between electrical resistance value Rp of variable resistor 125P within a current path including transistor TPP and electrical resistance value Rn of variable resistor 125N within a current path including transistor TPN, differential amplification between reference voltage VRIN and a voltage (VIN+$\Delta V1$+$\Delta V2$), which results from further addition of second offset correction voltage $\Delta V2$ due to the difference in electrical resistance to first voltage V1, can equivalently be carried out.

In particular, in order to eliminate offset in differential amplification, a voltage difference between a gate voltage (V1+$\Delta V1$) of transistor TPP and a voltage (Vtail) of node N21 and a voltage difference between a gate voltage of transistor TPN and Vtail are balanced to satisfy a condition of $\Delta V1 = \Delta V2$.

For example, when the first correction voltage is positive ($\Delta V1 > 0$), correction voltage $\Delta V2$ ($\Delta V2 > 0$) can be generated for positive correction voltage $\Delta V1$ such that a condition of Vtail–(VIN+$\Delta V1$+$\Delta V2$)=Vtail–VRIN is satisfied by satisfying a condition of Rp>Rn and setting an amount of voltage lowering in variable resistor 125P to be larger by $\Delta V2$ than an amount of voltage lowering in variable resistor 125N.

When first correction voltage is negative ($\Delta V1 < 0$), on the other hand, correction voltage $\Delta V2$ reverse in polarity to the correction voltage under the condition of $\Delta V1 > 0$ can be generated for negative correction voltage $\Delta V1$ such that a condition of Vtail–(VIN+$\Delta V1$)=Vtail+$\Delta V2$–VRIN is satisfied by satisfying a condition of Rn>Rp and by setting an amount of voltage lowering in variable resistor 125N to be larger by $\Delta V2$ than an amount of voltage lowering in variable resistor 125P.

When correction voltage $\Delta V2$ is defined as a value resulting from subtraction of voltage lowering in variable resistor 125N from voltage lowering in variable resistor 125P, it is expressed as $\Delta V2=(Rp-Rn)\cdot(Ibias21)/2$. Since a difference in resistance $(Rp-Rn)$ can be set to any of a positive value, a negative value, and zero depending on combination of control signals BP0 to BP3 and BN0 to BN3, correction voltage $\Delta V2$ can also be controlled to any of $\Delta V2>0$, $\Delta V2<0$, and $\Delta V2=0$. Thus, second correction voltage generation circuit 120 can equivalently provide second voltage $V2=VIN+\Delta V1+\Delta V2$ to output stage 150.

In particular, by adjusting control signals BP0 to BP3 and BN0 to BN3 to satisfy a condition of VOUT=VIN under voltage follower connection, a state that offset is corrected with VOUT=VIN+$\Delta V1$+$\Delta V2$ can be established. In other words, second correction voltage generation circuit 120 can generate correction voltage $\Delta V2$ in accordance with first correction voltage $\Delta V1$ to satisfy a condition of $\Delta V1+\Delta V2=-V$offset for offset voltage Voffset of operational amplifier 100.

In second correction voltage generation circuit 120, a plurality of resistive elements RP0 to RP3 included in variable resistor 125P are each implemented by a resistive element having a negative temperature coefficient. Representatively, a resistive element having a negative temperature coefficient can be composed of a semiconductor-based material in a CMOS process such as a non-silicide P-type polysilicon resistance or a non-silicide N-type polysilicon resistance or a component large in negative temperature coefficient such as a non-silicide P-type polysilicon high resistance or a non-silicide N-type polysilicon high resistance or additionally also combination thereof.

In contrast, a plurality of resistive elements RN0 to RN3 included in variable resistor 125N are each implemented by a resistive element having a positive temperature coefficient. Representatively, the resistive element having a positive temperature coefficient can be composed of a metal-based material such as a poly resistance (POLY resistance), a P+ diffusion resistance, or an N+ diffusion resistance, or additionally combination thereof. Alternatively, the resistive element having a positive temperature coefficient can also be composed of combination of a resistance large in positive temperature coefficient and a resistance small in negative temperature coefficient. Similarly, the resistive element having a negative temperature coefficient can also be composed of combination of a resistance large in negative temperature coefficient and a resistance small in positive temperature coefficient.

When second correction voltage generation circuit 120 generates second positive correction voltage $\Delta V2$ ($\Delta V2>0$), the condition of $Rp>Rn$ can be satisfied by turning on (closing) all of bypass switches SWN0 to SWN3 and turning off (opening) at least one of bypass switches SWP0 to SWP3. Thus, at least one of resistive elements RP0 to RP3 having the negative temperature coefficient is included in the current path, whereas resistive elements RN0 to RN3 having the positive temperature coefficient are not included in the current path. Consequently, when the condition of $\Delta V2>0$ is set, electrical resistance value Rp of variable resistor 125P lowers with increase in temperature and hence $\Delta V2$ also decreases. In other words, the temperature coefficient of $\Delta V2$ can be "negative".

In contrast, in generating second negative correction voltage $\Delta V2$ ($\Delta V2<0$), the condition of $Rn>Rp$ can be satisfied by turning on (closing) all of bypass switches SWP0 to SWP3 and turning off (opening) at least one of bypass switches SWN0 to SWN3. Thus, at least one of resistive elements RN0 to RN3 having the positive temperature coefficient is included in the current path, whereas resistive elements RP0 to RP3 having the negative temperature coefficient are not included in the current path. Consequently, when the condition of $\Delta V2<0$ is set, electrical resistance value Rn of variable resistor 125N increases with increase in temperature and hence $\Delta V2$ increases. In other words, the temperature coefficient of $\Delta V2$ can be "positive".

Though four resistive elements implement each of variable resistors 125P and 125N in the exemplary configuration in FIG. 5, variable resistors 125P and 125N can each be implemented by any plurality of resistive elements.

Output stage 150 includes transistors 151 and 152 and a capacitor 153. Transistor 151 is implemented by a P-type field effect transistor and connected between power supply node Np and an output node No of operational amplifier 100. Transistor 151 provides a constant current by receiving input of a constant bias voltage Vbias at its gate.

Transistor 152 is implemented by an N-type field effect transistor and connected between output node No and reference voltage node Ng. Capacitor 153 is connected between output node No and the gate of transistor 152. Transistor 152 has the gate connected to node N22 of second correction voltage generation circuit 120. Output voltage VOUT in accordance with a voltage (Vamp) resulting from differential amplification of a voltage resulting from addition of first correction voltage $\Delta V1$ and second correction voltage $\Delta V2$ to input voltage VIN and reference voltage VRIN is thus provided to output node No. In particular, when operational amplifier 100 operates as the voltage follower circuit, the condition of VOUT=VIN+$\Delta V1$+$\Delta V2$ is satisfied.

In FIG. 5, transistor TPP corresponds to one embodiment of the "third field effect transistor," transistor TPN corresponds to one embodiment of the "fourth field effect transistor," variable resistor 125P corresponds to one embodiment of the "first variable resistor," and variable resistor 125N corresponds to one embodiment of the "second variable resistor." Node N21 corresponds to one embodiment of the "first node," node N22 corresponds to one embodiment of the "second node," node N23 corresponds to one embodiment of the "third node," and current sources 121 to 123 correspond to one embodiment of the "second current source group." The plurality of bypass switches SWP0 to SWP3 and SWN0 to SWN3 arranged in the plurality of resistive elements implementing variable resistors 125P and 125N correspond to one embodiment of the "electrical resistance difference variable mechanism."

FIG. 6 shows a chart illustrating an operating state of the first and second correction voltage generation circuits.

Referring to FIG. 6, offset voltage Voffset of operational amplifier 100 can be measured as a difference between an input voltage and an output voltage (Voffset=VIN−VOUT) of operational amplifier 100 in voltage follower connection, for example, under a condition that control signals B11 to B14, B21 to B24, BP0 to BP3, and BN0 to BN3 are set to set both of first correction voltage $\Delta V1$ and second correction voltage $\Delta V2$ to zero ($\Delta V1=\Delta V2=0$).

When the offset voltage is positive (Voffset>0), the offset voltage can be corrected by setting first correction voltage $\Delta V1$ and second correction voltage $\Delta V2$ to be negative to satisfy a condition of Voffset+$\Delta V1$+$\Delta V2=0$. In contrast, when the offset voltage is negative (Voffset≤0), the offset voltage can be corrected by setting first correction voltage $\Delta V1$ and second correction voltage $\Delta V2$ to be positive to satisfy the condition of Voffset+$\Delta V1$+$\Delta V2$=0.

Control signals BN0 to BN3 and BP0 to BP3 are thus set in second correction voltage generation circuit 120 such that first correction voltage $\Delta V1$ and second correction voltage $\Delta V2$ from first correction voltage generation circuit 110 are equal in polarity (positive/negative) to each other. For example, first correction voltage $\Delta V1$ and second correction voltage $\Delta V2$ can comparably be set ($\Delta V1$=$\Delta V2$=−Voffset/2).

As described above, in correction voltage generation circuit 110, positive/negative of first correction voltage $\Delta V1$ is the same as the polarity (positive/negative) of the temperature coefficient thereof, whereas in second correction voltage generation circuit 120, positive/negative of second correction voltage $\Delta V2$ is reverse to positive/negative of temperature dependency thereof. Consequently, it is understood that the temperature coefficient of $\Delta V1$ is reverse in polarity to the temperature coefficient of $\Delta V2$ in any case of positive $\Delta V1$ and $\Delta V2$ and negative $\Delta V1$ and $\Delta V2$. The temperature coefficient of $\Delta V1$ corresponds to the "first temperature coefficient" and the temperature coefficient of $\Delta V2$ corresponds to the "second temperature coefficient."

An exemplary operation for correcting the offset voltage will now be described with reference to FIGS. 7 and 8. FIG. 7 shows a chart illustrating an operation by first correction voltage generation circuit 110 and second correction voltage generation circuit 120 when the offset voltage is negative (Voffset<0).

Referring to FIG. 7, the offset voltage is corrected by setting a condition of $\Delta V1$=$\Delta V2$=0 (a positive-side correction level="0") when a condition of Voffset=0 [mv] is set and setting a condition of $\Delta V1$=$\Delta V2$=1 [mv] (the positive-side correction level="1") when a condition of Voffset=−2 [mv] is set. Similarly, the offset voltage can be corrected by setting a condition of $\Delta V1$=$\Delta V2$=2 [mv] (the positive-side correction level="2") when a condition of Voffset=−4 [mv] is set and setting a condition of $\Delta V1$=$\Delta V2$=3 [mv] (the positive-side correction level="3") when a condition of Voffset=−6 [mv] is set.

First correction voltage generation circuit 110 in FIG. 3 is assumed to be designed such that transistors TP11 and TN11 have W/L=1000 and each of transistors TP12, TP13, TP14, TN12, TN13, and TN14 has W/L=25.

At the positive-side correction level="3", control signals B11 to B14 are set such that, in transistors TP11 to TP14, input voltage VIN is provided to the gate of transistor TP11 whereas power supply voltage VDDA is provided to the gates of transistors TP12 to TP14. In contrast, control signals B21 to B24 are set such that the gates of transistors TP21 to TP24 are connected to node N13.

Since transistor TP1 in FIG. 4 has W/L=1000 and transistor TP2 has W/L=1075, (k2/k1) is calculated as (k2/k1)=1.075. Thermal voltage VT (VT=k·T/q) is approximately 26 [mv] at T=300 [K]. Therefore, when it is assumed that η=1.66 is set based on a process value in the expressions (7) and (8), $\Delta V1$≈3 [mV] is derived from the expression (7) and d($\Delta V1$)/dT≈600μ [V/deg] is derived from the expression (8).

At the positive-side correction level="1", as compared with the positive-side correction level="3", by providing power supply voltage VDDA to the gates of two of transistors TP22 to TP24, transistor TP2 has W/L=1025 with respect to transistor TP1 having W/L=1000. Consequently, under a condition of (k2/k1)=1.025, $\Delta V1$≈1 [mV] can be derived and d($\Delta V1$)/dT≈200μ [V/deg] can be derived from the expression (8).

Similarly, at the positive-side correction level="2", as compared with the positive-side correction level="3", by providing power supply voltage VDDA to the gate of one of transistors TP22 to TP24, transistor TP2 has W/L=1050 with respect to transistor TP1 having W/L=1000. Consequently, under a condition of (k2/k1)=1.050, $\Delta V1$≈2 [mV] can be derived and d($\Delta V1$)/dT≈400μ [V/deg] can be derived from the expression (8).

Second correction voltage generation circuit 120 in FIG. 5 is designed with temperature dependency of current sources 121 to 123 being suppressed, such that a condition of Ibias22=Ibias23=100 [nA] is satisfied, that is, output current Ibias21 from current source 121 satisfies a condition of Ibias21=200 [nA]. Resistive elements RP0 to RP3 and RN0 to RN3 can each have an electrical resistance value of 10 [kΩ].

At the positive-side correction level="1", $\Delta V1$=100 [nA]×10 [kΩ]=1 [mV] can be generated with a condition of Rp of variable resistor 125P being set to Rp=10 [kΩ] (on the other hand, Rn=0) by turning on (closing) bypass switches SWN0 to SWN3 and SWP1 to SWP3 and turning off (opening) only bypass switch SWP0.

Similarly, at the positive-side correction level="2", $\Delta V1$=100 [nA]×20 [kΩ]=2 [mV] can be generated with a condition of Rp of variable resistor 125P being set to Rp=20 [kΩ] (on the other hand, Rn=0) by turning on (closing) bypass switches SWN0 to SWN3 and SWP2 to SWP3 and turning off (opening) bypass switches SWP0 and SWP 1. At the positive-side correction level="3", $\Delta V1$=100 [nA]×30 [kΩ]=3 [mV] can be generated with a condition of Rp of variable resistor 125P being set to Rp=30 [kΩ] (on the other hand, Rn=0) by turning on (closing) bypass switches SWN0 to SWN3 and SWP3 and turning off (opening) bypass switches SWP0 to SWP2.

The temperature coefficient of second correction voltage $\Delta V2$ from second correction voltage generation circuit 120 is set to cancel the temperature coefficient of first correction voltage $\Delta V1$ from first correction voltage generation circuit 110. Specifically, the temperature coefficient [Ω/deg] of resistive element RP0 through which a current passes at the positive-side correction level="1" is determined such that the temperature coefficient of $\Delta V2$ is set to −200μ [V/deg] at the positive-side correction level="1" at which a condition of $\Delta V2$=1 [mv] is satisfied.

Similarly, the temperature coefficient [Ω/deg] of resistive element RP1 is determined in consideration of the temperature coefficient of resistive element RP0 such that the temperature coefficient of $\Delta V2$ dependent on an average value of the temperature coefficients of resistive elements RP0 and RP1 through which a current passes at the positive-side correction level="2" at which a condition of $\Delta V2$=2 [mv] is satisfied is set to −400μ [V/deg].

The temperature coefficient [Ω/deg] of resistive element RP2 is further determined in consideration of the temperature coefficient of resistive elements RP0 and RP1 such that the temperature coefficient of $\Delta V2$ dependent on an average value of the temperature coefficients of resistive elements RP0 to RP2 through which a current passes at the positive-side correction level="3" at which a condition of $\Delta V2$=3 [mv] is satisfied is set to −600μ [V/deg].

At the positive-side correction level="0", in first correction voltage generation circuit 110, control signals B11 to B14 and B21 to B24 are set to satisfy a condition of (k2/k1)=1.0, and the condition of $\Delta V1$=0 is satisfied. In second correction voltage generation circuit 120, control signals BP0 to BP3 and BN0 to BN3 are set to turn on (close) each of bypass switches SWP0 to SWP3 and SWN0 to SWN3, so as to set the condition of Rn=Rp=0 and the condition of $\Delta V2$=0.

Consequently, at the positive-side correction level="1", with a condition of $\Delta V1=\Delta V2=1$ [mv] being set, a condition of a total correction voltage $(\Delta V1+\Delta V2)=2$ [mV] is satisfied and hence Voffset=−2 [mv] can be corrected. Similarly, at the positive-side correction level="2" $(\Delta V1=\Delta V2=2$ [mv]), Voffset=−4 [mv] can be corrected with the total correction voltage $(\Delta V1+\Delta V2)=4$ [mV]. At the positive-side correction level="3" $(\Delta V1=\Delta V2=3$ [mv]), Voffset=−6 [mv] can be corrected with the total correction voltage $(\Delta V1+\Delta V2)=6$ [mV].

FIG. 8 shows a chart illustrating an operation by first correction voltage generation circuit 110 and second correction voltage generation circuit 120 when the offset voltage is positive (Voffset>0).

Referring to FIG. 8, the offset voltage is corrected by setting the condition of $\Delta V1=\Delta V2=0$ (a negative-side correction level="0") when a condition of Voffset=0 [mv] is set and setting a condition of $\Delta V1=\Delta V2=−1$ [mv] (the negative-side correction level="1") when a condition of Voffset=2 [mv] is set. Similarly, the offset voltage can be corrected by setting a condition of $\Delta V1=\Delta V2=−2$ [mv] (the negative-side correction level="2") when a condition of Voffset=4 [mv] is set and setting a condition of $\Delta V1=\Delta V2=−3$ [mv] (the negative-side correction level="3") when a condition of Voffset=6 [mv] is set.

At the negative-side correction level="3", in contrast to the case of the positive-side correction level="3", control signals B11 to B14 are set such that input voltage VIN is provided to the gate of each of transistors TP11 to TP14. Furthermore, control signals B21 to B24 are set such that the gate of transistor TP21 is connected to node N13 and power supply voltage VDDA is provided to the gate of each of transistors TP22 to TP24.

Thus, since transistor TP1 in FIG. 4 has W/L=1075 and transistor TP2 has W/L=1000, (k2/k1) is calculated as (k2/k1)=1/1.075. Since a condition of ln(1/1.075)=−ln (1.075) is satisfied, polarity is reverse to the case of the positive-side correction level="3", and $\Delta V1 \approx −3$ [mV] and $d(\Delta V1)/dT \approx −600\mu$ [V/deg] are derived.

Similarly, at the negative-side correction level="1", control signals B11 to B14 and B21 to B24 are set such that transistor TP1 has W/L=1025 with respect to transistor TP2 having W/L=1000. Then, with a condition of (k2/k1)=1/1.025 being set, a condition of ln(k2/k1)=−ln(1.025) can be satisfied. Consequently, with the polarity being reverse to the case of the positive-side correction level="1", $\Delta V1 \approx −1$ [mV] and $d(\Delta V1)/dT \approx −200\mu$ [V/deg] can be derived.

Alternatively, at the negative-side correction level="2", control signals B11 to B14 and B21 to B24 are set such that transistor TP1 has W/L=1050 with respect to transistor TP2 having W/L=1000. Then, with a condition of (k2/k1)=1/1.05 being set, a condition of ln(k2/k1)=−ln(1.05) can be satisfied. Consequently, with the polarity being reverse to the case of the positive-side correction level="2", $\Delta V1 \approx −2$ [mV] and $d(\Delta V1)/dT \approx −400\mu$ [V/deg] can be derived.

On the other hand, in second correction voltage generation circuit 120 in FIG. 5, at the negative-side correction level="1", $\Delta V1=−1$ [mV] can be generated as a result of passage of Ibias23=100 [nA], with Rn=10 [kΩ] of variable resistor 125N being set (on the other hand, Rp=0 being set), by turning on (closing) bypass switches SWP0 to SWP3 and SWN1 to SWN3 and turning off (opening) only bypass switch SWN0.

At the negative-side correction level="2, $\Delta V1=−2$ [mV] can be generated as a result of passage of Ibias23=100 [nA], with Rn=20 [kΩ] of variable resistor 125N being set (on the other hand, Rp=0 being set), by turning on (closing) bypass switches SWP0 to SWP3 and SWN2 to SWN3 and turning off (opening) bypass switches SWN0 and SWN1.

Similarly, at the negative-side correction level="3", $\Delta V1=−3$ [mV] can be generated as a result of passage of Ibias23=100 [nA], with Rn=30 [kΩ] of variable resistor 125N being set (on the other hand, Rp=0 being set), by turning on (closing) bypass switches SWP0 to SWP3 and SWN3 and turning off (opening) bypass switches SWN0 to SWN2.

At the negative-side correction level="1", the temperature coefficient [Ω/deg] of resistive element RN0 can be determined to set the temperature coefficient of $\Delta V2$ to 200μ [V/deg]. Furthermore, at the negative-side correction level="2", the temperature coefficient of resistive element RN1 can be determined in consideration of the temperature coefficient of resistive element RN0 to set to 400μ [V/deg], the temperature coefficient of $\Delta V2$ dependent on the average value of the temperature coefficients of resistive elements RN0 and RN1 through which a current passes. Similarly, at the negative-side correction level="3", the temperature coefficient of resistive element RN2 can be determined in consideration of the temperature coefficients of resistive elements RN0 and RN1 to set to 600μ [V/deg], the temperature coefficient of $\Delta V2$ dependent on the average value of the temperature coefficients of resistive elements RN0 to RN2 through which a current passes.

Since the operation by first correction voltage generation circuit 110 and second correction voltage generation circuit 120 at the negative-side correction level="0" is similar to the operation at the positive-side correction level="0", detailed description will not be repeated.

Consequently, at the negative-side correction level="1", with a condition of $\Delta V1=\Delta V2=−1$ [mv] being set, the total correction voltage $(\Delta V1+\Delta V2)$ is calculated as $(\Delta V1+\Delta V2)=−2$ [mV] and hence Voffset=2 [mv] can be corrected therewith. Similarly, at the negative-side correction level="2" $(\Delta V1=\Delta V2=−2$ [mv]), Voffset=4 [mv] can be corrected with the total correction voltage $(\Delta V1+\Delta V2)=−4$ [mV]. At the negative-side correction level="3" $(\Delta V1=\Delta V2=−3$ [mv]), Voffset=6 [mv] can be corrected with the total correction voltage $(\Delta V1+\Delta V2)=−6$ [mV].

Throughout FIGS. 7 and 8, the temperature coefficient of first correction voltage $\Delta V1$ and the temperature coefficient of second correction voltage $\Delta V2$ are controlled to be equal to each other in absolute value and reverse to each other in polarity at each correction level on the positive side and the negative side.

Figure 9:
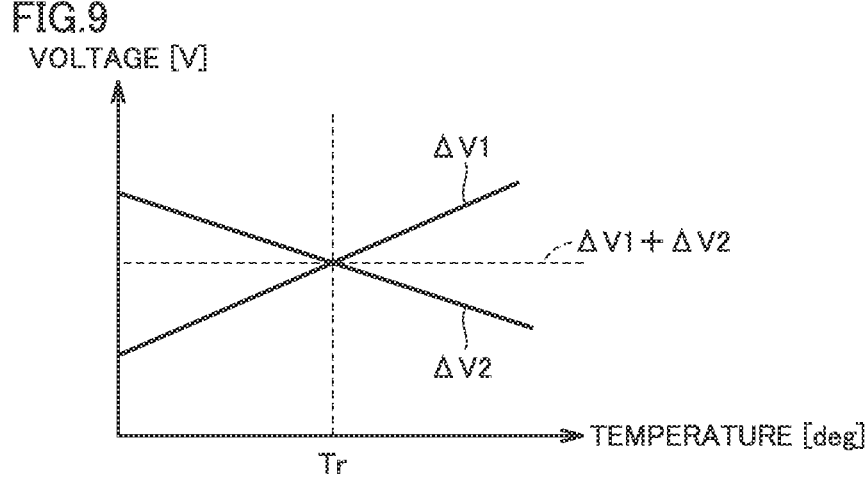
FIG. 9 is a conceptual diagram illustrating temperature characteristics of first and second correction voltages from the first and second correction voltage generation circuits.

Characteristics of first and second correction voltages $\Delta V1$ and $\Delta V2$ exhibit temperature characteristics as shown in FIG. 9. FIG. 9 shows an example where the condition of offset voltage Voffset<0 is set and first correction voltage $\Delta V1$ and second correction voltage $\Delta V2$ are positive.

Referring to FIG. 9, control signals B11 to B14 and B21 to B24 for first correction voltage generation circuit 110 and control signals BP0 to BP3 and BN0 to BN3 for second correction voltage generation circuit 120 are set to satisfy a condition of $\Delta V1=\Delta V2$ and $\Delta V1+\Delta V2+$Voffset=0 at a temperature Tr at the time of adjustment by the offset correction operation described with reference to FIG. 7.

When a temperature varies with control signals B11 to B14 and B21 to B24 and control signals BP0 to BP3 and BN0 to BN3 being fixed, first correction voltage $\Delta V1$ and second correction voltage $\Delta V2$ are varied in accordance with the temperature coefficient [V/deg] described with reference to FIG. 7.

As described with reference to FIG. 7, the temperature coefficient of first correction voltage $\Delta V1$ and the temperature coefficient of second correction voltage $\Delta V2$ are identical in absolute value and reverse in polarity to each other. Therefore, an amount of variation in first correction voltage $\Delta V1$ and an amount of variation in second correction voltage $\Delta V2$ with variation in temperature cancel each other, so that the total correction voltage ($\Delta V1+\Delta V2$) can be maintained constant with respect to variation in temperature.

Figure 10:
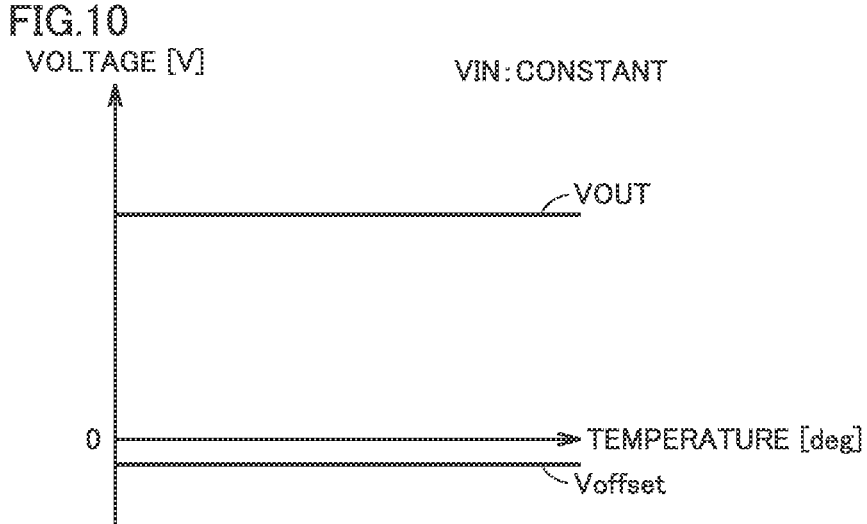
FIG. 10 is a conceptual diagram showing characteristics of an output voltage from the operational amplifier to which the offset correction circuit according to the first embodiment is applied.

FIG. 10 shows a conceptual diagram showing characteristics of an output voltage from the operational amplifier to which the offset correction circuit according to the first embodiment is applied.

Referring to FIG. 10, relatively low offset voltage Voffset present in operational amplifier 100 is corrected with the total correction voltage ($\Delta V1+\Delta V2$) shown in FIG. 9. Consequently, influence by offset voltage Voffset can be eliminated, for example, in operational amplifier 100 in voltage follower connection so as to maintain the condition of VOUT=VIN in correspondence with variation in temperature.

At this time, the temperature coefficient of first correction voltage $\Delta V1$ from first correction voltage generation circuit 110 and the temperature coefficient of second correction voltage $\Delta V2$ from second correction voltage generation circuit 120 are reverse in polarity to each other. Therefore, even though first correction voltage generation circuit 110 and second correction voltage generation circuit 120 are configured with an element having temperature dependency, the offset correction function with temperature drift being suppressed can be performed by suppressing fluctuation of $\Delta V1+\Delta V2$ with variation in temperature.

In the case of offset voltage Voffset>0 contrary to FIGS. 9 and 10 as well, the offset correction operation described with reference to FIG. 8 achieves the condition of $\Delta V1+\Delta V2+Voffset=0$ ($\Delta V1<0$ and $\Delta V2<0$) at the temperature at the time of adjustment, and the temperature coefficient of first correction voltage $\Delta V1$ and the temperature coefficient of second correction voltage $\Delta V2$ can be equal in absolute value and reverse in polarity to each other. Consequently, as in FIGS. 9 and 10, offset voltage correction with temperature drift being suppressed can be achieved.

As shown in FIG. 9, by correcting offset voltage Voffset with the condition of $\Delta V1=\Delta V2=-Voffset/2$ ($\Delta V1:\Delta V2=0.5:0.5$) being set, the temperature coefficient of $\Delta V1$ and the temperature coefficient of $\Delta V2$ opposite in polarity can be equal in absolute value to each other, so that $\Delta V1+\Delta V2$ can be constant with respect to variation in temperature and temperature drift can be suppressed.

Even though x is defined as $x \neq 0.5$ in an expression $\Delta V1:\Delta V2=x:(1-x)$, temperature drift can similarly be suppressed. Specifically, by setting the absolute value of the temperature coefficient of $\Delta V1$:the absolute value of the temperature coefficient of $\Delta V2=(1-x):x$, that is, an inverse ratio of $\Delta V1:\Delta V2$, $\Delta V1+\Delta V2$ can be maintained constant with respect to variation in temperature, and temperature drift can be suppressed.

Modification of First Embodiment

A preferred exemplary configuration of current source 121 of second correction voltage generation circuit 120 (FIG. 5) will be described in a modification of the first embodiment.

Figure 11:
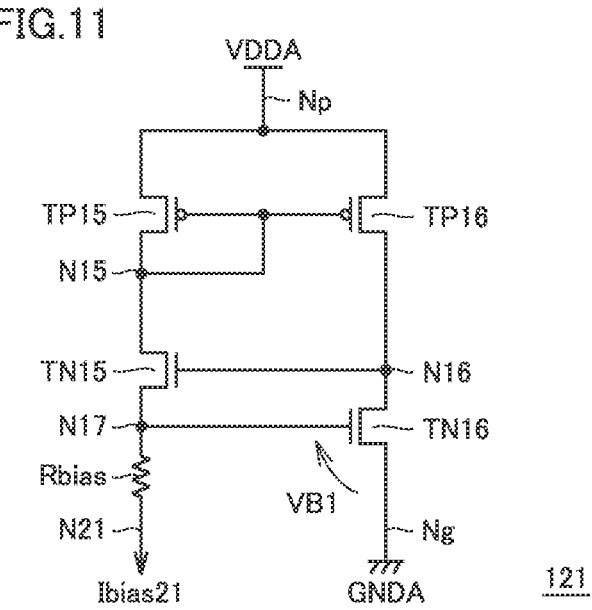
FIG. 11 is a circuit diagram illustrating a first exemplary configuration of a current source according to a modification of the first embodiment.

FIG. 11 is a circuit diagram illustrating a first exemplary configuration of a current source according to the modification of the first embodiment.

Referring to FIG. 11, current source 121 includes transistors TP15, TP16, TN15, and TN16, and a bias resistive element Rbias. An electrical resistance value (a bias resistance value) of bias resistive element Rbias is also denoted as Rbias below.

Each of transistors TP15 and TP16 is implemented by a p-type field effect transistor. Transistor TP15 is connected between power supply node Np and a node N15. Transistor TP16 is connected between power supply node Np and a node N16. Transistors TP15 and TP16 have gates connected in common to node N15.

Each of transistors TN15 and TN16 is implemented by an n-type field effect transistor. Transistor TN15 and resistive element Rbias are connected in series between node N15 and node N21 (FIG. 5). Transistor TN16 is connected between node N16 and reference voltage node Ng (GNDA) and bias resistive element Rbias is connected between node N17 and node N21. Transistor TN15 has the gate connected to node N16 and transistor TN16 has the gate connected to node N17.

Output current Ibias21 from current source 121 in FIG. 11 is in proportion to (VB1/Rbias) represented by a voltage VB1 of node N17 and bias resistance value Rbias. By implementing bias resistive element Rbias by an element of a low temperature coefficient of resistance (TCR) with suppressed temperature dependency, the temperature coefficient of second correction voltage $\Delta V2$ from second correction voltage generation circuit 120 can appropriately be set by adjusting only temperature dependency of resistive elements RP0 to RP3 and RN0 to RN3 shown in FIG. 5.

Figure 23:
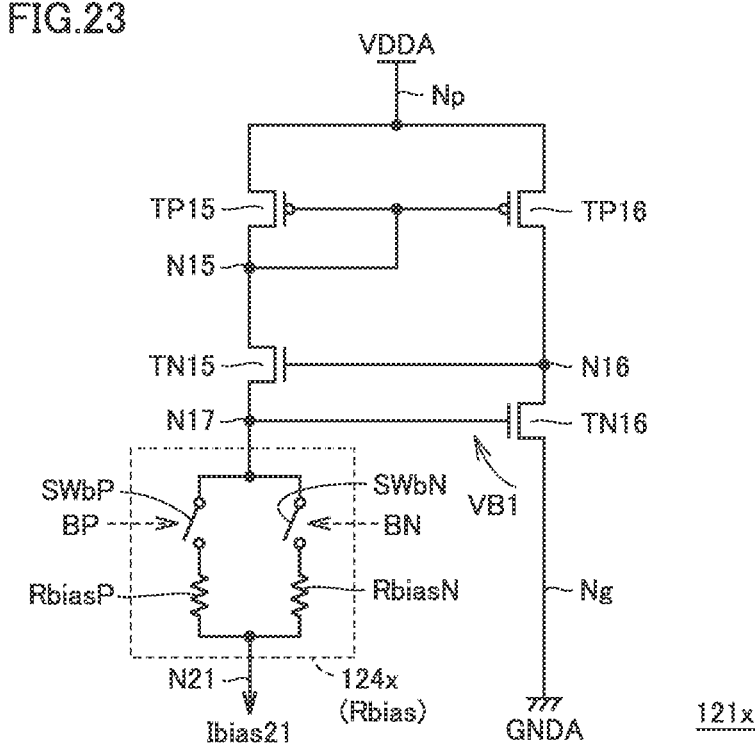
FIG. 23 is a first circuit diagram illustrating a further modification of a current source according to a modification of the first embodiment.

Alternatively, a current source 121x shown in FIG. 23 is employed instead of current source 121 in FIG. 11, so that output current Ibias21 having temperature dependency on node N21 can also be provided.

When FIG. 23 is compared with FIG. 11, current source 121x shown in FIG. 23 includes a bias resistance variable circuit 124x instead of bias resistive element Rbias in current source 121 in FIG. 11.

Bias resistance variable circuit 124x includes a resistive element RbiasP having a negative temperature coefficient, a resistive element RbiasN having a positive temperature coefficient, and switches SWbP and SWbN. Resistive elements RbiasP and RbiasN each have an electrical resistance value comparable to Rbias in FIG. 11. Resistive elements RbiasP and RbiasN are connected in parallel between nodes N17 and N21 with switches SWbP and SWbN being interposed.

By selectively turning on switches SWbP and SWbN in accordance with control signals BP and BN, one of resistive elements RbiasP and RbiasN can selectively be connected between nodes N17 and N21 as bias resistive element Rbias in FIG. 11. Specifically, when the first correction voltage is positive ($\Delta V1>0$) and first correction voltage $\Delta V1$ has a positive temperature coefficient, switch SWbP is turned on and resistive element RbiasP having the negative temperature coefficient serves as bias resistive element Rbias. Then, output current Ibias21 from current source 121x in accordance with (VB1/Rbias) can have the negative temperature coefficient.

In contrast, when the first correction voltage is negative ($\Delta V1<0$) and first correction voltage $\Delta V1$ has a negative temperature coefficient, switch SWbN is turned on and resistive element RbiasN having the positive temperature coefficient serves as bias resistive element Rbias. Then, output current Ibias21 from current source 121x can have the positive temperature coefficient.

Thus, with current source 121x, a current having a temperature coefficient reverse in polarity to first correction voltage $\Delta V1$ can be supplied to node N21 in accordance with the polarity of first correction voltage $\Delta V1$. Alternatively, by including a current source 121$y$ shown in FIG. 24 instead of current source 121 in FIG. 11, both of the polarity and the absolute value of the temperature coefficient of output current Ibias21 provided to node N21 can also variably be controlled.

Figure 24:
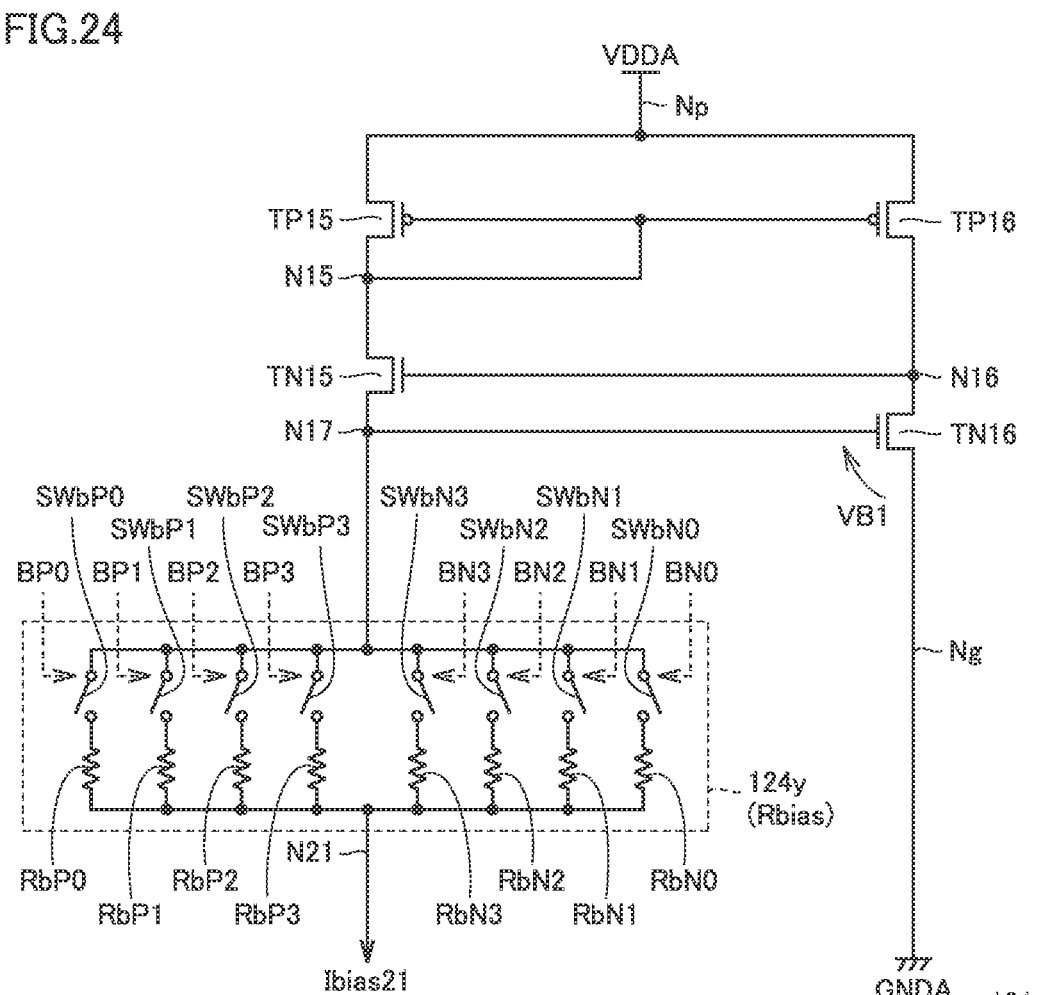
FIG. 24 is a second circuit diagram illustrating a further modification of a current source according to a modification of the first embodiment.

Current source 121$y$ shown in FIG. 24 includes a bias resistance variable circuit 124$y$ instead of bias resistive element Rbias in current source 121 in FIG. 11.

Bias resistance variable circuit 124$y$ includes resistive elements RbP0 to RbP3 each having a negative temperature coefficient, resistive elements RbN0 to RbN3 each having a positive temperature characteristic, and switches SWbP0 to SWbP3 and SWbN0 to SWbN3. Resistive elements RbP0 to RbP3 and RbN0 to RbN3 are connected in parallel between nodes N17 and N21 with switches SWbP0 to SWbP3 and SWbN0 to SWbN3 being interposed.

Resistive elements RbP0 to RbP3 and RbN0 to RbN3 each have an electrical resistance value comparable to Rbias in FIG. 11. On the other hand, resistive elements RbP0 to RbP3 are different in absolute value of the temperature coefficient (negative) among one another. Similarly, resistive elements RbN0 to RbN3 are different in absolute value of the temperature coefficient (positive) among one another.

For example, by selectively turning on one of switches SWbP0 to SWbP3 and SWbN0 to SWbN3 in accordance with control signals BP0 to BP3 and BN0 to BN3, one of resistive elements RbP0 to RbP3 and RbN0 to RbN3 can selectively be connected between nodes N17 and N21 as bias resistive element Rbias in FIG. 11.

Specifically, when the first correction voltage is positive ($\Delta V1{>}0$) and first correction voltage $\Delta V1$ has the positive temperature coefficient, by turning on one of switches SWbP0 to SWbP3 and using one of resistive elements RbP0 to RbP3 having the negative temperature coefficient as bias resistive element Rbias, output current Ibias21 from current source 121$y$ in accordance with (VB1/Rbias) can have the negative temperature coefficient. By selection from among resistive elements RbP0 to RbP3, the absolute value of the temperature coefficient (negative) can also variably be controlled. For example, as shown in FIG. 7, a resistive element larger in absolute value of the temperature coefficient (negative) as the absolute value of correction voltage $\Delta V1$ ($\Delta V1{>}0$) is larger can be selected as bias resistive element Rbias.

In contrast, when the first correction voltage is negative ($\Delta V1{<}0$) and first correction voltage $\Delta V1$ has the negative temperature coefficient, by turning on one of switches SWbN0 to SWbN3 and using one of resistive elements RbN0 to RbN3 having the positive temperature coefficient as bias resistive element Rbias, output current Ibias21 from current source 121$y$ can have the positive temperature coefficient. By selection from among resistive elements RbN0 to RbN3, the absolute value of the temperature coefficient (positive) can also variably be controlled. For example, as shown in FIG. 8, a resistive element larger in absolute value of the temperature coefficient (positive) as the absolute value of correction voltage $\Delta V1$ ($\Delta V1{<}0$) is larger can be selected as bias resistive element Rbias.

In FIGS. 23 and 24, bias resistance variable circuits 124$x$ and 124$y$ correspond to one embodiment of the "bias resistance variable mechanism." Current sources 121$x$ and 121$y$ correspond to the "first current source," and current sources 122 and 123 in FIG. 5 correspond to the "second current source" and the "third current source," respectively.

When current source 121$x$ or 121$y$ is employed, in variable resistors 125P and 125N (FIG. 5), resistive elements RN0 to RN3 and RP0 to RP3 can each be implemented by a low temperature coefficient of resistance (TCR) with suppressed temperature dependency. In this case, variable resistors 125P and 125N specialize in performing a function to adjust magnitude of correction voltage $\Delta V2$ with a difference in resistance (Rn–Rp).

Figure 12:
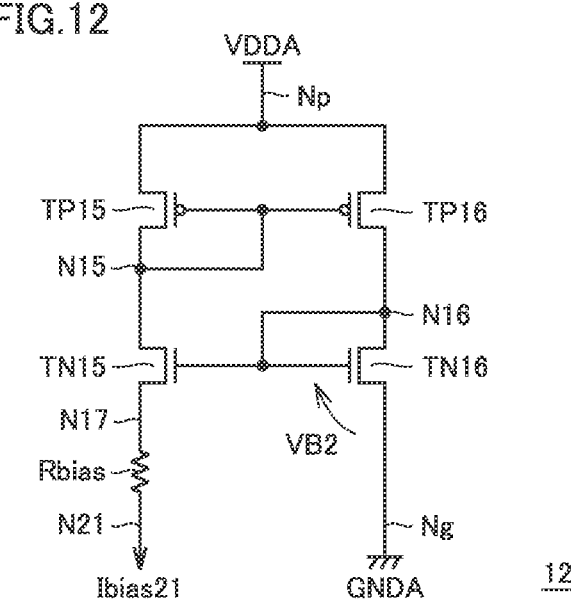
FIG. 12 is a circuit diagram illustrating a second exemplary configuration of the current source according to a modification of the first embodiment.

FIG. 12 is a circuit diagram illustrating a second exemplary configuration of a current source according to a modification of the first embodiment.

Current source 121 shown in FIG. 12 is different from the configuration in FIG. 11 in where gates of transistors TN15 and TN16 are connected. Specifically, transistors TN15 and TN16 have the gates connected in common to node N16.

Output current Ibias21 from current source 121 in FIG. 12 is in proportion to (VB1/Rbias$^2$) expressed with a voltage VB2 of node N16 and bias resistance value Rbias. Thus, with variation in output current Ibias21 in inverse proportion to the square of bias resistance value Rbias, an amount of variation in output current Ibias21 increases with an amount of variation in bias resistance value Rbias. Therefore, when bias resistance element Rbias is configured a resistive element having a positive or negative temperature coefficient in application of current source 121 in the configuration in FIG. 12 to second correction voltage generation circuit 120, second correction voltage $\Delta V2$ can have a larger temperature coefficient.

In the configuration in FIG. 12 as well, bias element resistor Rbias of current source 121 can be replaced with bias resistance variable circuit 124$x$ (FIG. 23) or 124$y$ (FIG. 24). Thus, a variably controllable range of bias resistance value Rbias can be wider in coordination with polarity and an absolute value of first correction voltage $\Delta V1$.

Second Embodiment

Since the first embodiment assumes that offset voltage Voffset of operational amplifier 100 has a constant value with respect to variation in temperature (FIG. 10), combination of control signals B11 to B14 and B21 to B24 for first correction voltage generation circuit 110 and control signals BP0 to BP3 and BN0 to BN3 for second correction voltage generation circuit 120 is fixed to one type. Consequently, highly accurate offset voltage correction with temperature drift being suppressed can be achieved with a relatively simplified configuration and without dynamic control.

In the field of the sensor interface in recent years, however, systems requiring 0.1 [mV]-order accuracy in offset voltage of operational amplifier 100, inclusive of fluctuation in temperature, tends to increase. Consequently, there is a concern about insufficient accuracy in offset correction on the premise that offset voltage Voffset has a constant value. In a second embodiment, a configuration of an offset correction circuit for further correcting temperature dependency of an offset voltage will be described.

Figure 13:
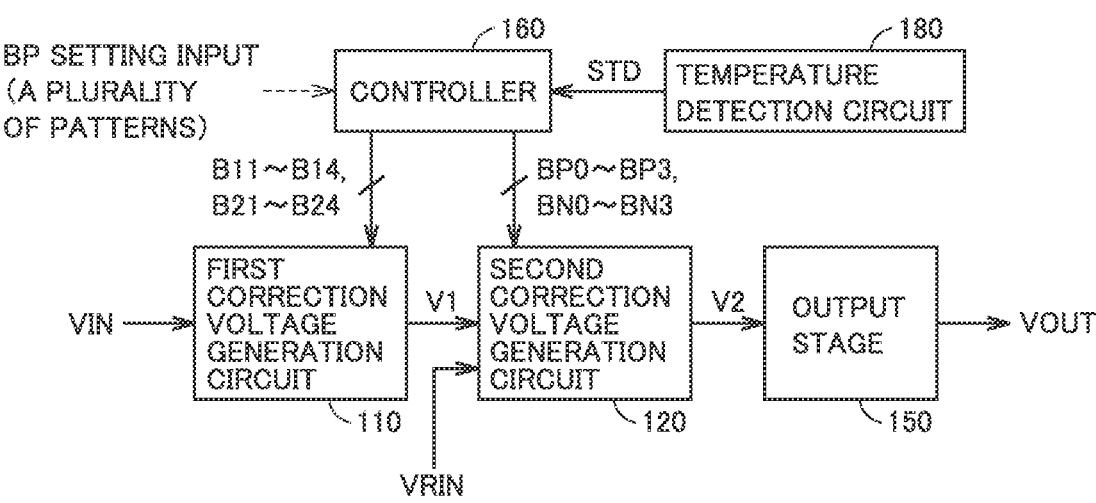
FIG. 13 is a block diagram illustrating an exemplary configuration of an operational amplifier to which an offset correction circuit according to a second embodiment is applied.

FIG. 13 is a block diagram illustrating an exemplary configuration of an operational amplifier to which an offset correction circuit according to the second embodiment is applied.

Referring to FIG. 13, in the second embodiment, operational amplifier 100 further includes a temperature detection circuit 180 in addition to the configuration in FIG. 2 (the first embodiment). For controller 160, a plurality of patterns of combination of control signals B11 to B14 and B21 to B24 and control signals BP0 to BP3 and BN0 to BN3 are determined in advance.

Controller 160 selects one of the plurality of patterns in accordance with an output from temperature detection circuit 180, and provides control signals B11 to B14 and B21 to B24 to first correction voltage generation circuit 110 and control signals BP0 to BP3 and BN0 to BN3 to second correction voltage generation circuit 120.

Figure 14:
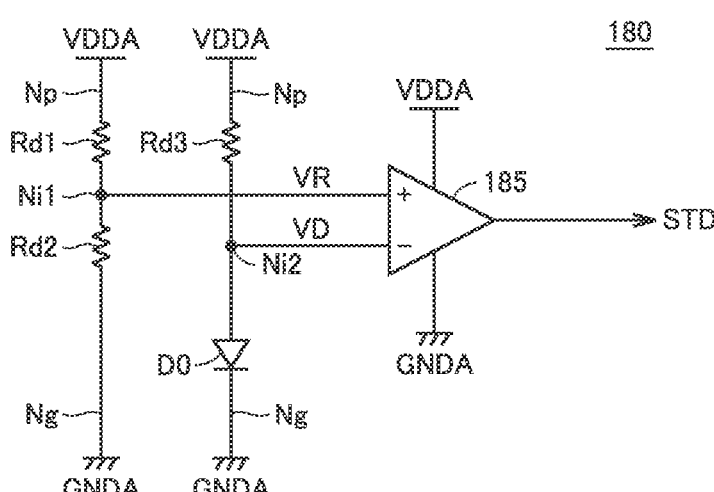
FIG. 14 is a circuit diagram illustrating an exemplary configuration of a temperature detection circuit shown in FIG. 13.

FIG. 14 shows an exemplary configuration of temperature detection circuit 180.

Referring to FIG. 14, temperature detection circuit 180 includes resistive elements Rd1 to Rd3, a diode D0, and a comparator 185. Electrical resistance values of resistive elements Rd1 to Rd3 are also simply denoted as Rd1 to Rd3 below.

Resistive elements Rd1 and Rd2 are connected in series between power supply node Np and reference voltage node Ng with a node Ni1 being interposed. Resistive elements Rd1 and Rd2 are made, for example, from elements identical in material so as to have similar temperature characteristics.

Resistive element Rd3 and diode D0 are connected in series between power supply node Np and reference voltage node Ng with a node Ni2 being interposed.

Node Ni1 and node Ni2 are connected to two input terminals of comparator 185, respectively. Comparator 185 provides a temperature detection signal STD indicating a result of comparison between a voltage at one input terminal (node Ni1) and a voltage at the other input terminal (node Ni2). Temperature detection signal STD is set to the logic high level (which is also simply denoted as the "H level" below) when a voltage VR of node Ni1 is higher than a voltage VD of node Ni2. When a condition of VR<VD is satisfied, temperature detection signal STD is set to the logic low level (which is also simply denoted as the "L level" below).

Figure 15:
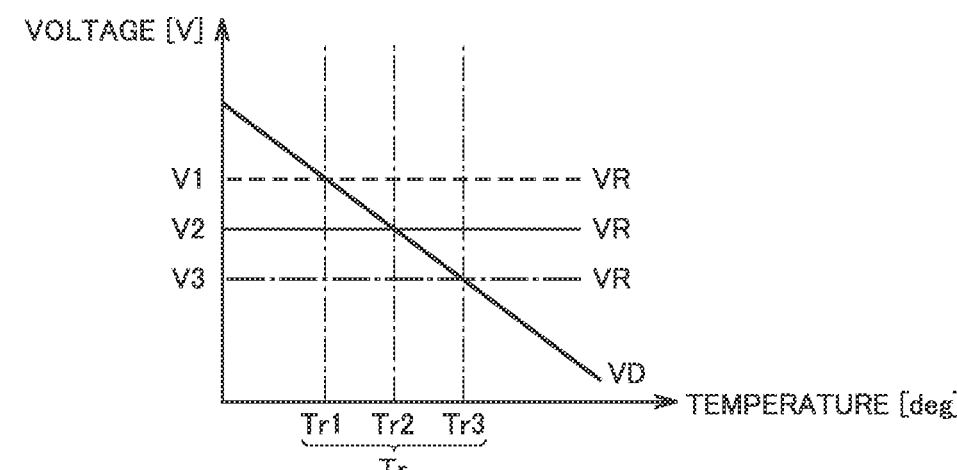
FIG. 15 is a conceptual diagram illustrating an operation by the temperature detection circuit shown in FIG. 14.

FIG. 15 shows a conceptual diagram illustrating an exemplary operation by temperature detection circuit 180.

Referring to FIG. 15, voltage VR of node Ni1 corresponds to a divided voltage of power supply voltage VDDA by resistive elements Rd1 and Rd2. Since resistive elements Rd1 and Rd2 are comparable to each other in temperature characteristics, electrical resistance values Rd1 and Rd2 vary together with variation in temperature, and therefore a voltage division ratio therebetween is maintained constant. In other words, voltage VR is constant with respect to variation in temperature.

In contrast, by designing temperature dependency of resistive element Rd3 to be higher than temperature dependency of a diode current, voltage VD of node Ni2 can be varied with variation in temperature. For example, by applying an element having a positive temperature coefficient, an electrical resistance of which increases with increase in temperature, as resistive element Rd3, voltage VD of node Ni2 lowers with increase in temperature.

Therefore, by comparing voltage VR constant with respect to variation in temperature with voltage VD that varies with variation in temperature, whether a temperature To of operational amplifier 100 (which is also referred to as an operational amplifier temperature To below) is higher or lower than a reference temperature TR corresponding to voltage VR can be detected. In the example in FIG. 15, in a region where a condition of To<TR is satisfied, a condition of VD>VR is satisfied and hence temperature detection signal STD is set to the H level. In a region where a condition of To>TR is satisfied, a condition of VD<VR is satisfied and hence temperature detection signal STD is set to the L level.

By varying the voltage division ratio between resistive elements Rd1 and Rd2, voltage VR can freely be set. For example, when a condition of VR=V1 to V3 is set, TR can be set to TR=TR1 to TR3, respectively. Therefore, by arranging N (N being a natural number) temperature detection circuits 180 different in reference temperature TR, in which of (N+1) temperature regions operational amplifier temperature To is in can be sensed. It is assumed below that one temperature detection circuit 180 is arranged to sense in which of a room-temperature region and a high-temperature region operational amplifier temperature To is in.

Figure 16:
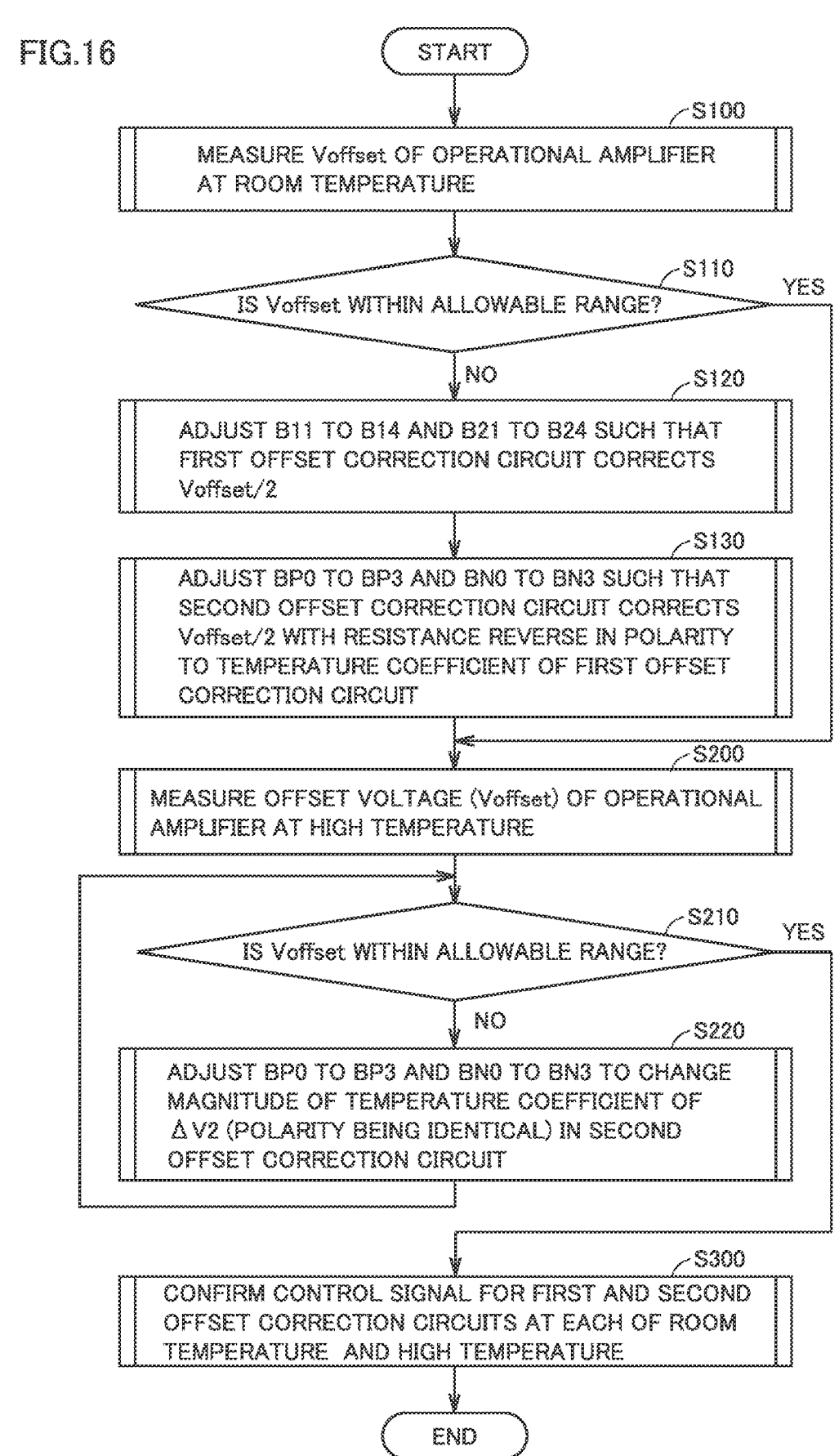
FIG. 16 is a flowchart illustrating a processing procedure for determining in advance a pattern of control signals for offset correction in the operational amplifier to which the offset correction circuit according to the second embodiment is applied.

FIG. 16 shows a flowchart illustrating a processing procedure for determining in advance a pattern of control signals for offset correction in the operational amplifier to which the offset correction circuit according to the second embodiment is applied. By the time operational amplifier 100 performs an on-line operation in accordance with the flowchart shown in FIG. 16, patterns of control signals B11 to B14 and B21 to B24 and control signals BP0 to BP3 and BN0 to BN3 are determined for each of the room-temperature region and the high-temperature region.

In step S100, offset voltage Voffset of operational amplifier 100 at a room temperature is measured. Offset voltage Voffset can be measured based on a voltage difference (VOUT−VIN) between input voltage VIN and output voltage VOUT of operational amplifier 100 in voltage follower connection as described above.

Controller 160 can perform processing in step S100 based on a detection value from a voltage sensor (not shown) to detect input voltage VIN and output voltage VOUT while control signals B11 to B14 and B21 to B24 and control signals BP0 to BP3 and BN0 to BN3 are set in accordance with an operation at the positive-side or negative-side correction level="0" in FIGS. 7 and 8.

In step S110, whether or not measured offset voltage Voffset is within a predetermined allowable range is determined. When offset voltage Voffset is not within the allowable range (determination as NO in S110), steps S120 and S130 for offset correction are performed.

In step S120, control signals B11 to B14 and B21 to B24 for first correction voltage generation circuit 110 are set to generate first correction voltage ΔV1 for correcting half of measured offset voltage Voffset. Controller 160 provides set control signals B11 to B14 and B21 to B24 to first correction voltage generation circuit 110.

As described above, positive/negative and magnitude of first correction voltage ΔV1 is determined by a ratio (k2/k1) of a transistor size between transistors TP1 and TP2 in FIG. 4 adjusted in accordance with control signals B11 to B14 and B21 to B24. Therefore, by setting control signals B11 to B14 and B21 to B24 such that (VOUT−VIN) varies from Voffset to Voffset/2 under voltage follower connection, first correction voltage ΔV1=−Voffset/2 can be generated.

At this time, an initial value table for control signals B11 to B14 and B21 to B24 corresponding to offset voltage Voffset measured in step S100 can be created in advance similarly to the correction level described with reference to FIGS. 7 and 8. In step S120, control signals B11 to B14 and B21 to B24 can be adjusted from the initial value such that a measured value of (VOUT−VIN) with correction voltage ΔV1 being generated attains to (Voffset/2).

In step S130, controller 160 further provides control signals BP0 to BP3 and BN0 to BN3 to second correction voltage generation circuit 120 for setting ΔV2 to ΔV2=−Voffset/2. Specifically, control signals BP0 to BP3 and BN0 to BN3 can be adjusted such that a measured value of (VOUT−VIN) with correction voltage ΔV2 being generated in addition to correction voltage ΔV1 adjusted to (Voffset/2) attains to zero. Thus, a condition of ΔV1=ΔV2 and ΔV1+ΔV2=−Voffset can be satisfied.

As described above, second correction voltage generation circuit 120 generates second correction voltage ΔV2 identical in polarity to first correction voltage ΔV1 whereas second correction voltage ΔV2 is reverse in polarity of the temperature coefficient to first correction voltage ΔV1 from first correction voltage generation circuit 110.

In step S130, an initial value table corresponding to measured offset voltage Voffset (S100) can be created in advance also for control signals BP0 to BP3 and BN0 to BN3. Specifically, in step S130, control signals BP0 to BP3 and BN0 to BN3 can be adjusted from the initial value such that the measured value of (VOUT–VIN) with correction voltage ΔV2 being generated attains to zero.

Control signals B11 to B14 and B21 to B24 (first correction voltage generation circuit 110) and control signals BP0 to BP3 and BN0 to BN3 (second correction voltage generation circuit 120) after the processing in steps S120 and S130 are stored in controller 160 as the pattern in the room-temperature region.

In succession, in step S200, offset voltage Voffset of operational amplifier 100 is measured while operational amplifier 100 is set to a high-temperature state by a not-shown test apparatus. In step S200, controller 160 can provide control signals B11 to B14 and B21 to B24 (first correction voltage generation circuit 110) and control signals BP0 to BP3 and BN0 to BN3 (second correction voltage generation circuit 120) stored as the control signals in the room-temperature region.

When offset voltage Voffset is within the allowable range in this state (determination as YES in S210), the process proceeds to step S300, and control signals B11 to B14 and B21 to B24 (first correction voltage generation circuit 110) and control signals BP0 to BP3 and BN0 to BN3 (second correction voltage generation circuit 120) stored as the pattern in the room-temperature region are confirmed as the pattern of the control signals in common between the room-temperature region and the high-temperature region for use in common between the room-temperature region and the high-temperature region.

When offset voltage Voffset is out of the allowable range in the high-temperature region (determination as NO in S210), in S220, control signals BP0 to BP3 and BN0 to BN3 are adjusted to change magnitude of the temperature coefficient of second correction voltage ΔV2 from second correction voltage generation circuit 120.

For example, in order to increase an absolute value of second correction voltage ΔV2 while the temperature is high, control signals BP0 to BP3 and BN0 to BN3 are adjusted from the pattern in the room-temperature region so as to alternatively open the bypass switch of the resistive element relatively large in absolute value of the temperature coefficient. Alternatively, in contrast, in order to decrease the absolute value of second correction voltage ΔV2 while the temperature is high, control signals BP0 to BP3 and BN0 to BN3 are adjusted from the pattern in the room-temperature region so as to alternatively open the bypass switch of the resistive element relatively small in absolute value of the temperature coefficient. Control signals B11 to B14 and B21 to B24 for first correction voltage generation circuit 110 can be maintained in the pattern stored in the room-temperature region.

Measurement of offset voltage Voffset is conducted and determination in step S210 is made while controller 160 provides the control signal in S220. Processing in S220 can repeatedly be performed while determination as NO is made in S210 until offset voltage Voffset is within the allowable range.

When offset voltage Voffset is within the allowable range (determination as YES in S210), control signals BP0 to BP3 and BN0 to BN3 (second correction voltage generation circuit 120) at that time point are confirmed as the pattern in the high-temperature region. On the other hand, the pattern of control signals B11 to B14 and B21 to B24 for first correction voltage generation circuit 110 the same as in the room-temperature region is confirmed as the pattern in the high-temperature region.

Consequently, the pattern in each of the room-temperature region and the high-temperature region, of both of control signals B11 to B14 and B21 to B24 (first correction voltage generation circuit 110) and control signals BP0 to BP3 and BN0 to BN3 (second correction voltage generation circuit 120) is confirmed. Processing for determining in advance a control signal for offset correction in operational amplifier 100 thus ends.

The processing shown in FIG. 16 can be performed by a test apparatus (not shown) for operational amplifier 100 as a test pattern program to receive a detection value from the voltage sensor (not shown) for input voltage VIN and output voltage VOUT of operational amplifier 100 and to provide a command to vary the control signal to controller 160. A plurality of confirmed patterns of the control signals are provided to controller 160 and stored therein.

Alternatively, the voltage sensor for input voltage VIN and output voltage VOUT can also be provided to controller 160 so that controller 160 executes a test program. In this case, a command to launch the test program is provided to controller 160.

Figure 17:
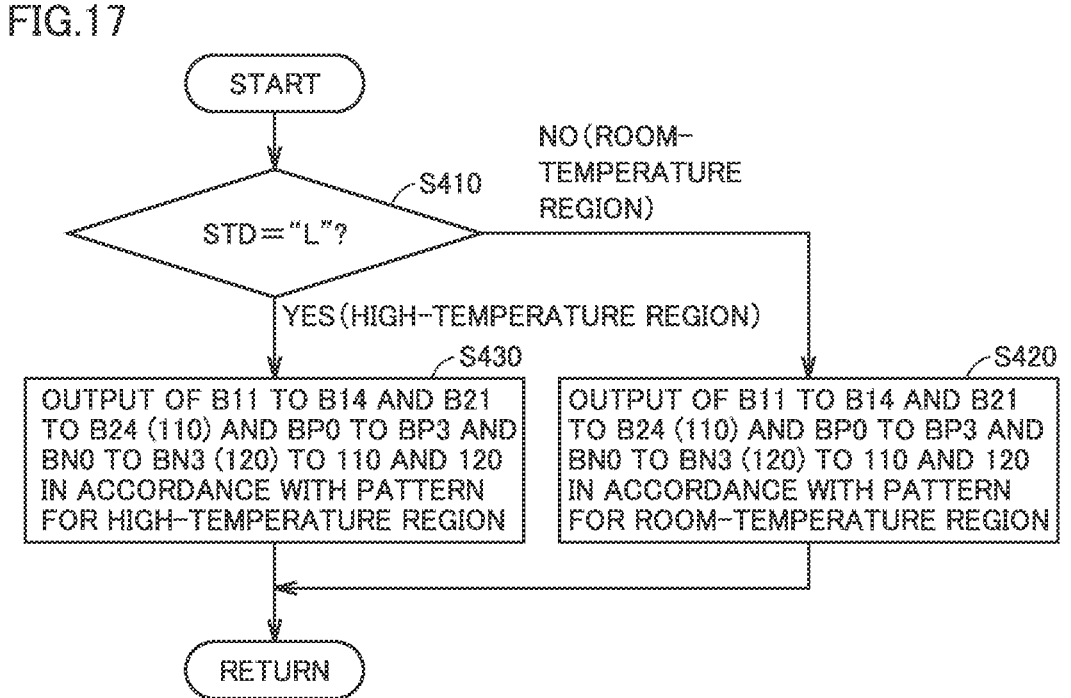
FIG. 17 is a flowchart illustrating processing for setting a control signal for offset correction while the operational amplifier to which the offset correction circuit according to the second embodiment is applied is operating.

FIG. 17 is a flowchart illustrating processing for setting a control signal for offset correction while the operational amplifier to which the offset correction circuit according to the second embodiment is applied is operating. Processing shown in FIG. 17 is performed by controller 160.

Referring to FIG. 17, in step S410, controller 160 determines a temperature region based on temperature detection signal STD from the temperature detection circuit (FIG. 13). When a condition of STD=the H level is satisfied (determination as NO in S410), in step S420, control signals B11 to B14 and B21 to B24 and control signals BP0 to BP3 and BN0 to BN3 are provided to first correction voltage generation circuit 110 and second correction voltage generation circuit 120 in accordance with the pattern in the room-temperature region of the patterns in the room-temperature region and the high-temperature region stored in controller 160.

When the condition of STD=the L level is satisfied (determination as YES in S410), in S430, controller 160 provides control signals B11 to B14 and B21 to B24 and control signals BP0 to BP3 and BN0 to BN3 to first correction voltage generation circuit 110 and second correction voltage generation circuit 120 in accordance with the pattern in the high-temperature region. Consequently, the temperature coefficient of second correction voltage ΔV2 varies between the room-temperature region and the high-temperature region.

Figure 18:
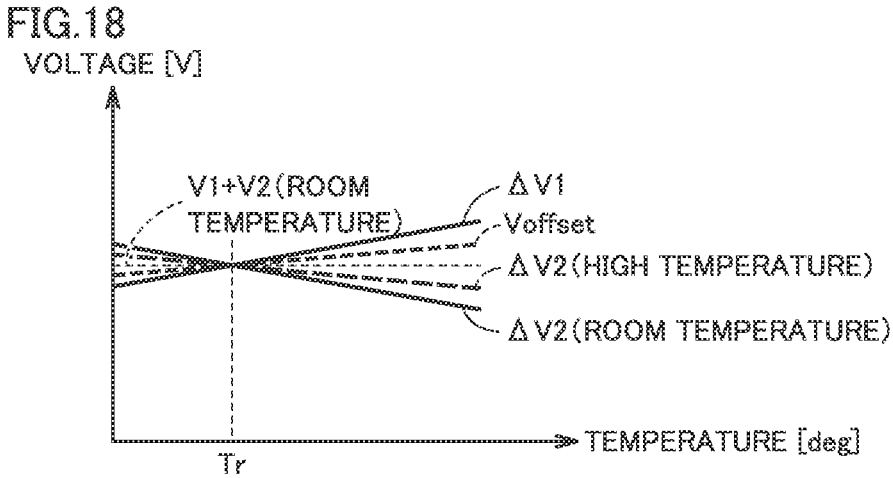
FIG. 18 is a conceptual diagram illustrating an exemplary operation by the offset correction circuit according to the second embodiment.
Figure 19:
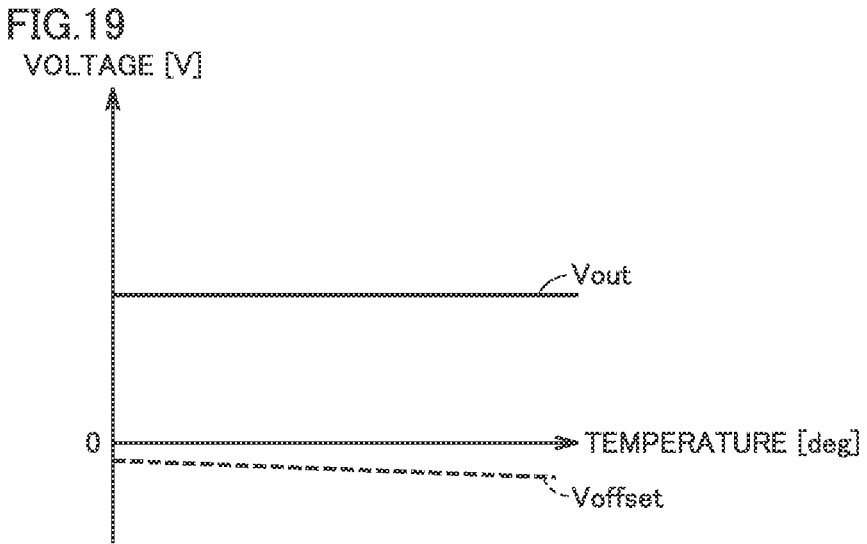
FIG. 19 is a conceptual diagram showing characteristics of an output voltage from the operational amplifier to which the offset correction circuit according to the second embodiment is applied.

FIG. 18 shows a conceptual diagram illustrating an exemplary operation by the offset correction circuit according to the second embodiment. FIG. 19 shows a conceptual diagram showing characteristics of an output voltage from the operational amplifier to which the offset correction circuit according to the second embodiment is applied.

Referring to FIGS. 18 and 19, in the second embodiment, offset voltage Voffset has temperature dependency. As described with reference to FIG. 9, relation of ΔV1+ΔV2+Voffset=0 is satisfied between first correction voltage ΔV1 and second correction voltage ΔV2, and offset voltage Voffset, so that the offset voltage is corrected.

As shown in FIG. 18, first correction voltage generation circuit 110 and second correction voltage generation circuit 120 are controlled to satisfy the condition of ΔV1>0 and ΔV2>0 in order to correct offset voltage Voffset<0. First correction voltage ΔV1 and second correction voltage ΔV2 (solid line) set to satisfy the condition of ΔV1+ΔV2+Voffset=0 at a temperature Tr in the room-temperature region have the temperature characteristics similar to those described with reference to FIG. 9.

In the example in FIG. 18, the absolute value of offset voltage Voffset (Voffset<0) increases with increase in temperature. Therefore, in the high-temperature region, in connection with ΔV1+ΔV2 (a dotted line) in accordance with setting in the room-temperature region, there is a concern about increase in value of |ΔV1+ΔV2+Voffset| and lowering in accuracy in offset correction.

Therefore, in the high-temperature region, control signals BP0 to BP3 and BN0 to BN3 (second correction voltage generation circuit 120) are switched from the pattern in the room-temperature region (S420) to the pattern in the high-temperature region (S430). Thus, as second correction voltage ΔV2 is generated in accordance with the temperature characteristics shown with the dotted line in the figure, the value of |ΔV1+ΔV2+Voffset| can be brought closer to 0 and offset can highly accurately be corrected also in the high-temperature region.

Consequently, even though such temperature dependency as increase in absolute value of the negative offset voltage with increase in temperature is seen as shown in FIG. 19, for example, influence by offset voltage Voffset can be eliminated to maintain VOUT=VIN in correspondence with variation in temperature in operational amplifier 100 in voltage follower connection.

Though FIGS. 16 and 18 illustrate an example in which first correction voltage ΔV1 is common between the room-temperature region and the high-temperature region and only the temperature coefficient of second correction voltage ΔV2 varies therebetween, both of correction voltage ΔV1 and correction voltage ΔV2 can also be switched in each of the room-temperature region and the high-temperature region. In this case, the patterns of control signals B11 to B14 and B21 to B24 (first correction voltage generation circuit 110) and control signals BP0 to BP3 and BN0 to BN3 (second correction voltage generation circuit 120) can separately be set for each of the room-temperature region and the high-temperature region by performing processing comparable to that in S120 and S130 when determination as NO is made in S210 in the processing in FIG. 16.

Though an example in which the control signal is switched with the temperature region being divided into two temperature regions (the room-temperature region/the high-temperature region) is described in the second embodiment, the temperature region can also be divided into three or more temperature regions. In this case, patterns of control signals B11 to B14 and B21 to B24 (first correction voltage generation circuit 110) and control signals BP0 to BP3 and BN0 to BN3 (second correction voltage generation circuit 120) should be confirmed in advance for each of the three or more temperature regions and stored in controller 160. Furthermore, by increasing the number of arranged temperature detection circuits 180 different in reference temperature TR as described above, in which sub-divided temperature regions operational amplifier temperature To is in can be sensed. Therefore, even though the temperature region is divided into three or more temperature regions as well, control signals corresponding to the current temperature region among the plurality of (at least three) patterns of the control signals can selectively be provided to first correction voltage generation circuit 110 and second correction voltage generation circuit 120 based on temperature detection signals STD from a plurality of temperature detection circuits 180.

Third Embodiment

A modification of a configuration of second correction voltage generation circuit 120 is described in a third embodiment.

Figure 20:
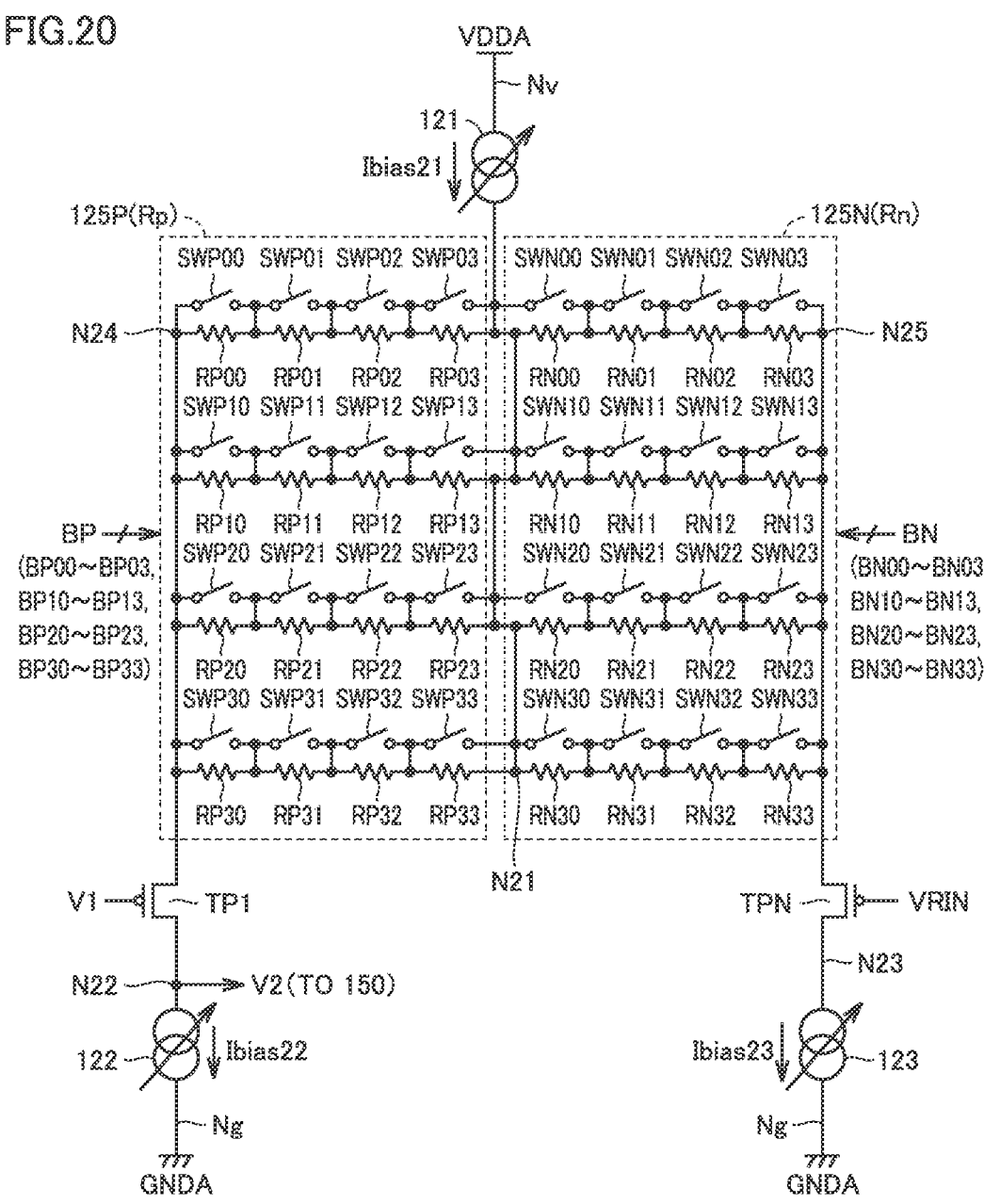
FIG. 20 is a circuit diagram illustrating an exemplary configuration of a second correction voltage generation circuit according to a third embodiment.

Referring to FIG. 20, second correction voltage generation circuit 120 according to the third embodiment is different from the configuration shown in FIG. 5 in configuration of variable resistors 125P and 125N. Since second correction voltage generation circuit 120 shown in FIG. 20 is otherwise the same in configuration as in FIG. 5, detailed description will not be repeated.

Variable resistor 125P includes n×m (n and m each being a natural number equal to or larger than two) resistive elements connected in series and parallel between node N21 and node N24. In an exemplary configuration in FIG. 20, resistive elements RP00 to RP03, RP10 to RP13, RP20 to RP23, and RP30 to RP33 connected in series for each set of four (n=4) resistive elements are connected in parallel between node N21 and node N24 (m=4).

Bypass switches SWP00 to SWP03, SWP10 to SWP13, SWP20 to SWP23, and SWP30 to SWP33 are connected in parallel to resistive elements RP00 to RP03, RP10 to RP13, RP20 to RP23, and RP30 to RP33, respectively. Bypass switches SWP00 to SWP03, SWP10 to SWP13, SWP20 to SWP23, and SWP30 to SWP33 are opened and closed in accordance with control signals BP00 to BP03, BP10 to BP13, BP20 to BP23, and BP30 to BP33 from controller 160, respectively. Control signals BP00 to BP03, BP10 to BP13, BP20 to BP23, and BP30 to BP33 are also simply collectively referred to as a control signal BP below.

Similarly, variable resistor 125N includes n×m resistive elements connected in series and parallel between node N21 and node N25. In the exemplary configuration in FIG. 20, resistive elements RN00 to RN03, RN10 to RN13, RN20 to RN23, and RN30 to RN33 connected in series for each set of four (n=4) resistive elements are connected in parallel between node N21 and node N25 (m=4).

Bypass switches SWN00 to SWN03, SWN10 to SWN13, SWN20 to SWN23, and SWN30 to SWN33 are connected in parallel to resistive elements RN00 to RN03, RN10 to RN13, RN20 to RN23, and RN30 to RN33, respectively. Bypass switches SWN00 to SWN03, SWN10 to SWN13, SWN20 to SWN23, and SWN30 to SWN33 are opened and closed in accordance with control signals BN00 to BN03, BN10 to BN13, BN20 to BN23, and BN30 to BN33 from controller 160, respectively. Control signals BN00 to BN03, BN10 to BN13, BN20 to BN23, and BN30 to BN33 are also simply collectively referred to as a control signal BN below.

In second correction voltage generation circuit 120 in FIG. 20 as well, second correction voltage ΔV2 is generated by providing a difference between an amount of voltage lowering in variable resistor 125P and an amount of voltage lowering in variable resistor 125N by turning on (closing) all bypass switches in one of variable resistors 125P and 125N and turning off (opening) at least one bypass switch in the other thereof.

Electrical resistance values and temperature coefficients of the (n×m) resistive elements in each of variable resistors 125P and 125N can freely be combined. For example, all of the (n×m) resistive elements in variable resistor 125P do not have to be made from elements having a negative temperature coefficient, and at least one of them may be made from an element having a positive temperature coefficient. As in the first embodiment, when second correction voltage ΔV2 satisfies the condition of ΔV2>0, for setting the polarity of the temperature coefficient of second correction voltage ΔV2 to be reverse to the polarity (positive) of first correction voltage ΔV1, at least one bypass switch is turned off (opened) in variable resistor 125P. Control signal BP should be set such that the temperature coefficient of a combined resistance value of a group of resistive elements through which a current passes as a result of turn-off (opening) of the bypass switch is negative.

Similarly, all of the (n×m) resistive elements in variable resistor 125N do not have to be made from elements having a positive temperature coefficient, and at least one of them may be made from an element having a negative temperature coefficient. As in the first embodiment, when second correction voltage ΔV2 satisfies the condition of ΔV2<0, for setting the polarity of the temperature coefficient of second correction voltage ΔV2 to be reverse to the polarity (negative) of first correction voltage ΔV1, at least one bypass switch is turned off (opened) in variable resistor 125N. Control signal BP should be set such that the temperature coefficient of a combined resistance value of a group of resistive elements through which a current passes as a result of turn-off (opening) of the bypass switch is positive.

In FIG. 20, resistive elements RP00 to RP03, RP10 to RP13, RP20 to RP23, and RP30 to RP33 correspond to one embodiment of "a plurality of first resistive elements," bypass switches SWP00 to SWP03, SWP10 to SWP13, SWP20 to SWP23, and SWP30 to SWP33 correspond to one embodiment of "a plurality of first bypass switches," and control signals BP00 to BP03, BP10 to BP13, BP20 to BP23, and BP30 to BP33 correspond to one embodiment of "a plurality of first bypass switch control signals."

Similarly, resistive elements RN00 to RN03, RN10 to RN13, RN20 to RN23, and RN30 to RN33 correspond to one embodiment of "a plurality of second resistive elements," bypass switches SWN00 to SWN03, SWN10 to SWN13, SWN20 to SWN23, and SWN30 to SWN33 correspond to one embodiment of "a plurality of second bypass switches," and control signals BN00 to BN03, BN10 to BN13, BN20 to BN23, and BN30 to BN33 correspond to one embodiment of "a plurality of second bypass switch control signals."

In second correction voltage generation circuit 120 according to the third embodiment, the temperature characteristics of the electrical resistance values (a combined resistance value) of variable resistors 125P and 125N for generating second correction voltage ΔV2 can finely be controlled in accordance with control signals BP and BN. Consequently, temperature dependency of the resistive elements that make up variable resistors 125P and 125N can be compensated for and temperature dependency of second correction voltage ΔV2 can highly accurately be controlled. For example, compensation for characteristics of the resistive elements below is assumed.

FIG. 21 shows a conceptual graph for illustrating non-linear temperature dependency of a resistive element and compensation therefor.

FIG. 21 (a) shows dependency of an electrical resistance value on a square of a temperature by way of example of non-linear temperature dependency of an electrical resistance value of a resistive element. For example, when the electrical resistance value should be within a range from Rr0 to Rr1 in order to generate second correction voltage ΔV2 as defined in a set value, there is a concern about lowering in accuracy in offset correction due to a setting error of second correction voltage ΔV2 in a region lower in temperature than Tra and a region higher in temperature than Trb.

Therefore, in the second correction voltage generation circuit according to the third embodiment, at least one of the number of resistive elements through which a current passes in variable resistors 125P and 125N and a manner of connection thereof is varied by switching control signals BP and BN between a temperature region from Tra to Trb, and the region lower in temperature than Tra and the region higher in temperature than Trb.

Thus, as shown in FIG. 21 (b), lowering in electrical resistance value Rp, Rn of variable resistor 125P or 125N can equivalently be compensated for in the region lower in temperature than Tra and the region higher in temperature than Trb. Consequently, the setting error of second correction voltage ΔV2 can be suppressed also in the region lower in temperature than Tra and the region higher in temperature than Trb.

FIG. 22 shows a conceptual graph for illustrating fluctuation in resistance value and compensation therefor in the high-temperature region when a diffusion resistance on a semiconductor substrate is provided by a resistive element.

Referring to FIG. 22 (a), when a diffusion resistance on a semiconductor substrate is provided by a resistive element, a junction leakage current is generated in a region higher in temperature than a certain temperature such as a region higher in temperature than Trc (representatively, Trc=approximately 80 [° C.]). Since the junction leakage current is exponentially generated, it is ignorable in the region lower in temperature than Trc.

Consequently, an apparent electrical resistance value of the resistive element becomes lower with increase in temperature in the region higher in temperature than Trc. Consequently, the electrical resistance value is out of the range from Rr0 to Rr1 as in FIG. 21 in the high-temperature region, and hence there is a concern about lowering in accuracy in offset correction due to the setting error of second correction voltage ΔV2 in the region higher in temperature than Trc.

Therefore, in the second correction voltage generation circuit according to the third embodiment, by switching control signals BP and BN between the region lower in temperature than Trc and the region higher in temperature than Trc, at least one of the number of resistive elements through which a current passes in variable resistors 125P and 125N and a manner of connection thereof is varied.

Thus, as shown in FIG. 22 (b), lowering in electrical resistance value Rp, Rn in variable resistor 125P or 125N can equivalently be compensated for in the region higher in temperature than Trc. Consequently, the setting error of second correction voltage ΔV2 can be suppressed also in the temperature region where the junction leakage current is generated in the diffusion resistance.

The circuit configuration of current source 121 shown in FIGS. 11 and 12 can also be applied to second correction voltage generation circuit 120 (FIG. 20) according to the third embodiment. Alternatively, current sources 121x and 121y described with reference to FIGS. 23 and 24 can be employed instead of current source 121. Each resistive element that makes up variable resistors 125P and 125N can be implemented by a low temperature coefficient of resistance (TCR) with suppressed temperature dependency also in second correction voltage generation circuit 120 shown in FIG. 20.

In first correction voltage generation circuit 110 described in the first embodiment as well, the number of arranged transistors (corresponding to TP11 to TP14 in FIG. 3) that make up transistor TP1 and transistors (corresponding to TP21 to TP24 in FIG. 3) that make up transistor TP2 or a manner of connection thereof can freely be modified to improve a range of setting of first correction voltage ΔV1 and a temperature coefficient thereof and a resolution in setting so as to finely control a ratio (k2/k1) of the transistor size between transistors TP1 and TP2.

Though the first to third embodiments illustrate a configuration of the offset circuit applied to the operational amplifier applied as the sensor interface, the offset correction circuit according to the present embodiment can also be applied to an operational amplifier and a comparator for other applications.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

REFERENCE SIGNS LIST

100 operational amplifier; 110 first correction voltage generation circuit; 111 to 113, 121 to 123, 121x, 121y current source; 120 second correction voltage generation circuit; 124x, 124y bias resistance variable circuit; 125N, 125P variable resistor; 150 output stage; 151, 152, TN15, TN16, TP1, TP2, TP11 to TP16, TP21 to TP24, TPN, TPP transistor; 153 capacitor; 160 controller; 180 temperature detection circuit; 185 comparator; 500 sensor; 700 digital signal processing circuit; B11 to B14, B21 to B24 control signal (first correction voltage generation circuit); BN0 to BN3, BN00 to BN03, BN10 to BN13, BN20 to BN23, BN30 to BN33, BP0 to BP3, BP00 to BP03, BP10 to BP13, BP20 to BP23, BP30 to BP33 control signal (second correction voltage generation circuit); D0 diode; N10 to N13, N15 to N17, N21 to N25, Ni1, Ni2 node; Ng reference voltage node; No output node; Np power supply node; RN0 to RN3, RN00 to RN03, RN10 to RN13, RN20 to RN23, RN30 to RN33, RP0 to RP3, RP00 to RP03, RP10 to RP13, RP20 to RP23, RP30 to RP33, Rbias, RbiasN, RbiasP, RbN0 to RbN3, RbP0 to RbP3, Rd1 to Rd3 resistive element; SP11 to SP14, SP21 to SP24 switch; STD temperature detection signal (temperature detection circuit); SWN0 to SWN3, SWN00 to SWN03, SWN10 to SWN13, SWN20 to SWN23, SWN30 to SWN33, SWP0 to SWP3, SWP00 to SWP03, SWP10 to SWP13, SWP20 to SWP23, SWP30 to SWP33 bypass switch; SWbN, SWbN0 to SWbN3, SWbP, SWbP0 to SWbP3 switch

The invention claimed is:

1. An offset correction circuit comprising:
a current generation circuit to provide an output current having a first temperature coefficient; and
a correction voltage generation circuit to provide a correction voltage using the output current,
the correction voltage having a second temperature coefficient reverse in polarity to the first temperature coefficient.

2. The offset correction circuit according to claim 1, wherein
the correction voltage generation circuit includes:
a first variable resistor, connected between a first node to which the output current is provided from the current generation circuit and a second node, to generate the correction voltage when the output current passes through the first variable resistor; and
a second variable resistor, connected between the first node and a third node, to generate the correction voltage reverse in polarity to the correction voltage generated by first variable resistor when the output current passes through the second variable resistor.

3. The offset correction circuit according to claim 2, wherein
the first variable resistor includes
a plurality of first resistive elements connected in series and parallel between the first node and the second node, and
a plurality of first bypass switches connected in parallel to the plurality of first resistive elements, respectively,
the second variable resistor includes
a plurality of second resistive elements connected in series and parallel between the first node and the third node, and
a plurality of second bypass switches connected in parallel to the plurality of second resistive elements, respectively, and
a plurality of first bypass switch control signals to control opening and closing of the plurality of first bypass switches and a plurality of second bypass switch control signals to control opening and closing of the plurality of second bypass switches are provided to the correction voltage generation circuit.

4. The offset correction circuit according to claim 1, wherein
the current generation circuit is configured to provide the output current in accordance with an electrical resistance value of a bias resistive element, and
the current generation circuit includes a bias resistance variable mechanism to control a polarity of a temperature coefficient of the bias resistive element between positive and negative.

* * * * *